(12) United States Patent
Cornfeld

(10) Patent No.: US 9,853,180 B2
(45) Date of Patent: Dec. 26, 2017

(54) INVERTED METAMORPHIC MULTIJUNCTION SOLAR CELL WITH SURFACE PASSIVATION

(71) Applicant: Emcore Solar Power, Inc., Albuquerque, NM (US)

(72) Inventor: Arthur Cornfeld, Sandia Park, NM (US)

(73) Assignee: SolAero Technologies Corp., Albuquerque, NM (US)

( * ) Notice: Subject to any disclaimer, the term of this patent is extended or adjusted under 35 U.S.C. 154(b) by 770 days.

(21) Appl. No.: 13/921,756

(22) Filed: Jun. 19, 2013

(65) Prior Publication Data

US 2014/0373905 A1 Dec. 25, 2014

(51) Int. Cl.
| | |
|---|---|
| *H01L 31/18* | (2006.01) |
| *H01L 31/0216* | (2014.01) |
| *H01L 31/0725* | (2012.01) |
| *H01L 31/0735* | (2012.01) |
| *H01L 31/0687* | (2012.01) |

(52) U.S. Cl.
CPC .... *H01L 31/1868* (2013.01); *H01L 31/02168* (2013.01); *H01L 31/06875* (2013.01); *H01L 31/0725* (2013.01); *H01L 31/0735* (2013.01); *H01L 31/1892* (2013.01); *Y02E 10/544* (2013.01); *Y02P 70/521* (2015.11)

(58) Field of Classification Search
CPC .................. H01L 31/1868; H01L 31/02168
See application file for complete search history.

(56) References Cited

U.S. PATENT DOCUMENTS

| | | |
|---|---|---|
| 2004/0166681 A1 | 8/2004 | Iles et al. |
| 2009/0078309 A1 | 3/2009 | Cornfeld et al. |
| 2009/0078310 A1 | 3/2009 | Stan et al. |
| 2009/0155952 A1 | 6/2009 | Stan et al. |
| 2009/0229662 A1 | 9/2009 | Stan et al. |
| 2009/0272430 A1 | 11/2009 | Cornfeld et al. |
| 2010/0012175 A1 | 1/2010 | Varghese et al. |
| 2010/0186822 A1* | 7/2010 | Pan et al. ...................... 136/261 |
| 2010/0229926 A1* | 9/2010 | Newman et al. ............. 136/255 |
| 2012/0216857 A1* | 8/2012 | Tsai et al. ..................... 136/255 |

(Continued)

OTHER PUBLICATIONS

Kagadei et al. ("Effect of Sulfur Modification of GaAs Surface on Parameters of AuGeNi Ohmic Contacts"), Poster Session, Institute of High-Current Electronics, 2008, pp. 361-363.*

(Continued)

*Primary Examiner* — Daniel Luke

(57) ABSTRACT

A multijunction solar cell including an upper first solar subcell; a second solar subcell adjacent to the first solar subcell; a first graded interlayer adjacent to the second solar subcell; a third solar subcell adjacent to the first graded interlayer such that the third subcell is lattice mismatched with respect to the second subcell. A second graded interlayer is provided adjacent to the third solar subcell, and a lower fourth solar subcell is provided adjacent to the second graded interlayer, such that the fourth subcell is lattice mismatched with respect to the third subcell. An encapsulating layer composed of silicon nitride or titanium oxide disposed on the top surface of the solar cell, and an antireflection coating layer disposed over the encapsulating layer.

16 Claims, 30 Drawing Sheets

(56) References Cited

U.S. PATENT DOCUMENTS

2012/0318347 A1* 12/2012 Junghanel et al. ........... 136/256

OTHER PUBLICATIONS

Lai et al., "Performance Improvement of (NH4)2Sx-Treated III-V Compounds Multijunction Solar Cell Using Surface Treatment", Journal of the Electrochemical Society, pp. B1270-B1273, Oct. 7, 2008.*
Aiken et al., "Consideration of High Bandgap Subcells for Advanced Multijunction Solar Cells," *Conference Record of the 2006 IEEE 4th World Conference on Photovoltaic Energy Conversion*, 2006:838-841.
Lewis et al., "The Crystallographic Connection of MOCVD-Grown Monolithic Cascade Subcells Via Transparent Graded Layers," *Journal of Crystal Growth*, 1984; 69:515-526.
Lewis et al., "Recent Developments in Multijunction Solar Cell Research," *Solar Cells*, 1988; 24:171-183.
Schultz et al., "High Efficiency 1.0-eV GaInAs Bottom Solar Cell for 3-Junction Monolithic Stack," *IEEE*, 1990:148-152.
Stan et al., "Recent Advances in the Performance of Multi-Junction Space Solar Cells," 22nd European Photovoltaic Solar Energy Conference, Milan, Italy, Sep. 3-7, 2007; 5 pgs.
Wanlass et al., "Lattice-Mismatched Approaches for High-Performance, III-V Photovoltaic Energy Converters," *Conference Proceedings of the 31st IEEE Photovoltaic Specialists Conference and Exhibition*, Lake Buena Vista, FL, USA; Jan. 3-7, 2005; 530-535.
Wanlass et al., "Monolithic, Ultra-Thin GaInP/GaAs/GaInAs Tandem Solar Cells," 2006 IEEE 4th World Conference on Photovoltaic Energy Conversion, May 7-12, 2006, Waikoloa, Hawaii, USA; 729-732.

* cited by examiner

INVERTED METAMORPHIC MULTIJUNCTION SOLAR CELL WITH SURFACE PASSIVATION

GOVERNMENT RIGHTS STATEMENT

This invention was made with government support under Contracts No. FA 9453-04-2-0041 awarded by the U.S. Air Force. The Government has certain rights in the invention.

REFERENCE TO RELATED APPLICATIONS

This application is related to co-pending U.S. patent application Ser. No. 13/836,742 filed Mar. 15, 2013.

This application is related to co-pending U.S. patent application Ser. No. 13/831,406 filed Mar. 14, 2013.

This application is related to co-pending U.S. patent application Ser. No. 13/768,683 filed Feb. 13, 2013.

This application is a related to U.S. patent application Ser. No. 12/637,241, filed Dec. 14, 2009, which is a continuation-in-part of U.S. patent application Ser. No. 11/616,596, filed Dec. 27, 2006, and Ser. No. 12/544,001, filed Aug. 19, 2009.

This application is related to co-pending U.S. patent application Ser. No. 13/604,833 filed Sep. 6, 2012, which is a continuation-in-part of U.S. patent application Ser. No. 12/637,241, filed Dec. 14, 2009, which in turn is a continuation-in-part of U.S. patent application Ser. No. 11/616,596, filed Dec. 27, 2006, and Ser. No. 12/544,001, filed Aug. 19, 2009.

This application is related to co-pending U.S. patent application Ser. No. 13/569,794 filed Aug. 9, 2012.

This application is related to co-pending U.S. patent application Ser. No. 13/547,334 filed Jul. 12, 2012.

This application is related to co-pending U.S. patent application Ser. No. 13/473,802 filed May 17, 2012.

This application is related to co-pending U.S. patent application Ser. No. 13/465,477 filed May 7, 2012.

This application is related to co-pending U.S. patent application Ser. No. 13/463,069 filed May 3, 2012.

This application is related to co-pending U.S. patent application Ser. No. 13/440,331 filed Apr. 5, 2012.

This application is related to co-pending U.S. patent application Ser. No. 13/415,425 filed Mar. 8, 2012.

This application is related to co-pending U.S. patent application Ser. No. 13/401,181 filed Feb. 21, 2012.

This application is related to co-pending U.S. patent application Ser. No. 13/372,068 filed Feb. 13, 2012.

This application is related to co-pending U.S. patent application Ser. No. 13/315,877 filed Dec. 9, 2011.

This application is related to co-pending U.S. patent application Ser. No. 12/844,673 filed Jul. 27, 2010.

This application is related to co-pending U.S. patent application Ser. No. 12/813,408 filed Jun. 10, 2010.

This application is related to U.S. patent application Ser. No. 12/775,946 filed May 7, 2010, now U.S. Pat. No. 8,187,907.

This application is related to co-pending U.S. patent application Ser. No. 12/716,814, filed Mar. 3, 2010.

This application is related to co-pending U.S. patent application Ser. No. 12/708,361, filed Feb. 18, 2010.

This application is related to co-pending U.S. patent application Ser. No. 12/544,001, filed Aug. 19, 2009.

This application is related to U.S. patent application Ser. No. 12/537,361, filed Aug. 7, 2009, now U.S. Pat. No. 8,262,856.

This application is related to co-pending U.S. patent application Ser. No. 12/337,014 filed Dec. 17, 2008, now U.S. Pat. No. 7,785,989.

This application is related to U.S. patent application Ser. No. 12/267,812 filed Nov. 10, 2008, now U.S. Pat. No. 8,236,600.

This application is related to co-pending U.S. patent application Ser. No. 12/190,449, filed Aug. 12, 2008, now U.S. Pat. No. 7,741,146, and its divisional patent application Ser. No. 12/816,205, filed Jun. 15, 2010, now U.S. Pat. No. 8,039,291.

This application is related to U.S. patent application Ser. No. 12/187,477, filed Aug. 7, 2008, now U.S. Pat. No. 8,263,853, and its co-pending divisional application U.S. patent application Ser. No. 13/560,663 filed Jul. 27, 2012.

This application is related to co-pending U.S. patent application Ser. No. 12/218,558 filed Jul. 16, 2008.

This application is related to co-pending U.S. patent application Ser. No. 12/123,864 filed May 20, 2008.

This application is related to co-pending U.S. patent application Ser. No. 12/023,772, filed Jan. 31, 2008.

This application is related to U.S. patent application Ser. No. 11/956,069, filed Dec. 13, 2007, and its divisional application Ser. No. 12/187,454 filed Aug. 7, 2008, now U.S. Pat. No. 7,727,795.

This application is also related to co-pending U.S. patent application Ser. Nos. 11/860,142 and 11/860,183 filed Sep. 24, 2007.

This application is also related to co-pending U.S. patent application Ser. No. 11/445,793 filed Jun. 2, 2006, and its divisional Ser. No. 12/758,390 filed Apr. 12, 2010.

BACKGROUND OF THE INVENTION

1. Field of the Invention

The present invention relates to the field of semiconductor devices, and to fabrication processes and devices such as multijunction solar cells based on III-V semiconductor compounds including a metamorphic layer. Such devices are also known as inverted metamorphic multijunction solar cells.

2. Description of the Related Art

Solar power from photovoltaic cells, also called solar cells, has been predominantly provided by silicon semiconductor technology. In the past several years, however, high-volume manufacturing of III-V compound semiconductor multijunction solar cells for space applications has accelerated the development of such technology not only for use in space but also for terrestrial solar power applications. Compared to silicon, III-V compound semiconductor multijunction devices have greater energy conversion efficiencies and generally more radiation resistance, although they tend to be more complex to manufacture. Typical commercial III-V compound semiconductor multijunction solar cells have energy efficiencies that exceed 27% under one sun, air mass 0 (AM0), illumination, whereas even the most efficient silicon technologies generally reach only about 18% efficiency under comparable conditions. Under high solar concentration (e.g., 500×), commercially available III-V compound semiconductor multijunction solar cells in terrestrial applications (at AM1.5D) have energy efficiencies that exceed 37%. The higher conversion efficiency of III-V compound semiconductor solar cells compared to silicon solar cells is in part based on the ability to achieve spectral splitting of the incident radiation through the use of a plurality of photovoltaic regions with different band gap energies, and accumulating the current from each of the regions.

Typical III-V compound semiconductor solar cells are fabricated on a semiconductor wafer in vertical, multijunction structures. The individual solar cells or wafers are then disposed in horizontal arrays, with the individual solar cells connected together in an electrical series circuit. The shape and structure of an array, as well as the number of cells it contains, are determined in part by the desired output voltage and current.

Inverted metamorphic solar cell structures based on III-V compound semiconductor layers, such as described in M. W. Wanlass et al., Lattice Mismatched Approaches for High Performance, III-V Photovoltaic Energy Converters (Conference Proceedings of the 31$^{st}$ IEEE Photovoltaic Specialists Conference, Jan. 3-7, 2005, IEEE Press, 2005), present an important conceptual starting point for the development of future commercial high efficiency solar cells. However, the materials and structures for a number of different layers of the cell proposed and described in such reference present a number of practical difficulties relating to the appropriate choice of materials and fabrication steps.

Prior to the present invention, the materials and fabrication steps disclosed in the prior art have not been adequate to produce a commercially viable and energy efficient solar cell using commercially established fabrication processes for producing an inverted metamorphic multijunction cell structure.

SUMMARY OF THE INVENTION

Briefly, and in general terms, the present invention provides a method of forming a multijunction solar cell comprising an upper subcell, a middle subcell, and a lower subcell from a semiconductor substrate, by providing a substrate for the epitaxial growth of semiconductor material; forming an upper first solar subcell on said substrate having a first band gap using an MOCVD process; forming a middle second solar subcell over said first solar subcell having a second band gap greater than said first band gap; forming a lower third solar subcell over said second subcell having a third greater than said second band gap; etching a trough around the periphery of the substrate so as to form a mesa structure on the substrate including the first, second, and third subcells; passivating the exposed surface of the solar cell with a passivating material; depositing an encapsulating layer over the passivated surface; and depositing an anti-reflection coating layer over the encapsulating layer.

In another aspect the present invention provides a multijunction solar cell including a top first solar subcell having a first band gap; a middle second solar subcell disposed directly adjacent to said first subcell and having a second band gap smaller than said first band gap; a grading interlayer disposed directly adjacent to said second subcell and having a third band gap greater than second band gap, said grading interlayer being deposited using an MOCVD process; a bottom third solar subcell disposed and directly adjacent to said grading interlayer and being lattice mismatched with respect to said middle second subcell, and having a fourth band gap smaller than said second band gap; a plurality of metal grid lines disposed on the top surface of the first solar subcell, including at least one metal contact pad electrically connected to said grid lines and disposed adjacent to a first peripheral edge of said first solar subcell; a metal contact layer adjacent to said third solar subcell for making an electrical contact to the third solar subcell; an encapsulating layer composed of silicon nitride or titanium oxide disposed on the top surface of the solar cell; and an antireflection coating layer disposed over the encapsulating layer.

In another aspect the present invention provides a method of manufacturing a solar cell by providing a first substrate; forming an upper first solar subcell having a first band gap on said first substrate; forming a second solar subcell adjacent to said first solar subcell and having a second band gap smaller than said first band gap; forming a first graded interlayer adjacent to said second solar subcell; said first graded interlayer having a third band gap greater than said second band gap; forming a third solar subcell adjacent to said first graded interlayer, said third subcell having a fourth band gap smaller than said second band gap such that said third subcell is lattice mismatched with respect to said second subcell; forming a second graded interlayer adjacent to said third solar subcell; said second graded interlayer having a fifth band gap greater than said fourth band gap; forming a lower fourth solar subcell adjacent to said second graded interlayer, said lower subcell having a sixth band gap smaller than said fourth band gap such that said fourth subcell is lattice mismatched with respect to said third subcell; mounting a surrogate substrate on top of fourth solar subcell; removing the first substrate; etching a first trough around the periphery of said solar cell attached to the surrogate second substrate so as to form a mesa structure on said surrogate second substrate; passivating the exposed surface of the solar cell with a passivating material; depositing an encapsulating layer over the passivated surface; and depositing an anti-reflection coating layer over the encapsulating layer.

In some embodiments, a backside contact layer is formed on the lower fourth solar subcell.

In some embodiments, a discrete, spaced-apart bonding pads are formed over the surface of the backside contact layer.

In some embodiments, a contact metal layer is deposited prior to forming the upper first solar subcell.

In some embodiments, the depth of the first trough extends down to said backside contact metal layer.

In some embodiments, the passivating step is performed by application of ammonium sulphide.

In some embodiments, the encapsulating layer is composed of silicon nitride or titanium oxide.

In some embodiments, the encapsulating layer is deposited by chemical vapor deposition.

In some embodiments, the encapsulating layer is deposited immediately after the passivating step.

In some embodiments, the passivating step is performed by dipping the wafer in a solution of ammonium sulphide.

In some embodiments, the lower fourth subcell has a band gap in the range of 0.6 to 0.8 eV; the third subcell has a band gap in the range of 0.9 to 1.1 eV, the second subcell has a band gap in the range of 1.35 to 1.45 eV, and the first subcell has a band gap in the range of 1.8 to 2.1 eV.

In some embodiments, the first substrate is composed of gallium arsenide or germanium, and the surrogate substrate is composed of sapphire, GaAs, Ge or Si.

In some embodiments, the first graded interlayer is compositionally graded to lattice match the second subcell on one side and the third subcell on the other side, and the second graded interlayer is compositionally graded to lattice match the third subcell on one side and the bottom fourth subcell on the other side.

In some embodiments, the first graded interlayer is composed of any of the As, P, N, Sb based III-V compound semiconductors subject to the constraints of having the in-plane lattice parameter greater or equal to that of the second subcell and less than or equal to that of the third subcell, and having a band gap energy greater than that of the second subcell and of the third subcell.

In some embodiments, the second graded interlayer is composed of any of the As, P. N, Sb based III-V compound semiconductors subject to the constraints of having the in-plane lattice parameter greater or equal to that of the third subcell and less than or equal to that of the bottom fourth subcell, and having a band gap energy greater than that of the third subcell and of the fourth subcell.

In some embodiments, the first and second graded interlayers are composed of $(In_xGa_{1-x})_y Al_{1-y}As$ with x and y selected such that the band gap of each interlayer remains constant throughout its thickness.

In some embodiments, the band gap of the first graded interlayer remains constant at 1.5 eV, and the band gap of the second graded interlayer remains constant at 1.1 eV.

In some embodiments, the first subcell is composed of and InGaP emitter layer and an InGaP base layer, the second subcell is composed of InGaP emitter layer and a GaAs base layer, the third subcell is composed of an InGaP emitter layer and an InGaAs base layer, and the bottom fourth subcell is composed of an InGaAs base layer and an InGaAs emitter layer lattice matched to the base layer.

Some implementations of the present disclosure may incorporate or implement fewer of the aspects and features noted in the foregoing summaries.

Additional aspects, advantages, and novel features of the present disclosure will become apparent to those skilled in the art from this disclosure, including the following detailed description as well as by practice of the disclosure. While the disclosure is described below with reference to preferred embodiments, it should be understood that the disclosure is not limited thereto. Those of ordinary skill in the art having access to the teachings herein will recognize additional applications, modifications and embodiments in other fields, which are within the scope of the disclosure as disclosed and claimed herein and with respect to which the disclosure could be of utility.

BRIEF DESCRIPTION OF THE DRAWINGS

The invention will be better and more fully appreciated by reference to the following detailed description when considered in conjunction with the accompanying drawings, wherein.

DESCRIPTION OF THE PREFERRED EMBODIMENT

Figure 1:
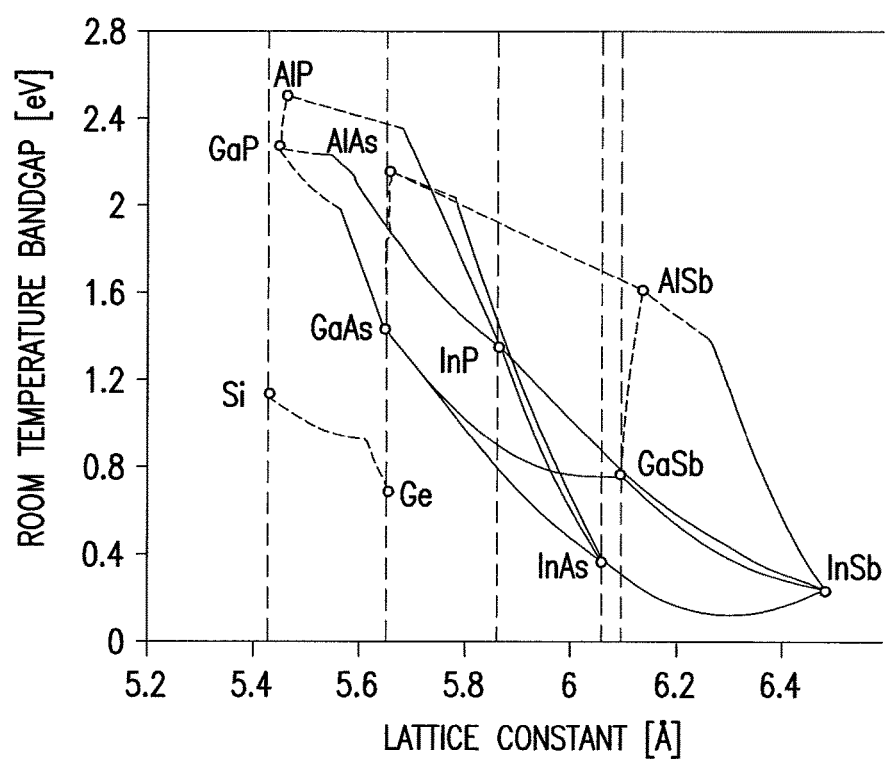
FIG. 1 is a graph representing the bandgap of certain binary materials and their lattice constants.

Details of the present invention will now be described including exemplary aspects and embodiments thereof. Referring to the drawings and the following description, like reference numbers are used to identify like or functionally similar elements, and are intended to illustrate major features of exemplary embodiments in a highly simplified diagrammatic manner. Moreover, the drawings are not intended to depict every feature of the actual embodiment nor the relative dimensions of the depicted elements, and are not drawn to scale.

The basic concept of fabricating an inverted metamorphic multijunction (IMM) solar cell is to grow the subcells of the solar cell on a substrate in a "reverse" sequence. That is, the high band gap subcells (i.e. subcells with band gaps in the range of 1.8 to 2.1 eV), which would normally be the "top" subcells facing the solar radiation, are grown epitaxially on a semiconductor growth substrate, such as for example GaAs or Ge, and such subcells are therefore lattice-matched to such substrate. One or more lower band gap middle subcells (i.e. with band gaps in the range of 1.2 to 1.8 eV) can then be grown on the high band gap subcells.

At least one lower subcell is formed over the middle subcell such that the at least one lower subcell is substantially lattice-mismatched with respect to the growth substrate and such that the at least one lower subcell has a third lower band gap (i.e. a band gap in the range of 0.7 to 1.2 eV). A surrogate substrate or support structure is then attached or provided over the "bottom" or substantially lattice-mismatched lower subcell, and the growth semiconductor substrate is subsequently removed. (The growth substrate may then subsequently be re-used for the growth of a second and subsequent solar cells).

A variety of different features of inverted metamorphic multijunction solar cells are disclosed in the related applications noted above. Some or all of such features may be included in the structures and processes associated with the solar cells of the present invention. However, more particularly, in one embodiment of the present disclosure, the process is directed to the fabrication of a four junction inverted metamorphic solar cell using two different metamorphic layers, all grown on a single growth substrate. In that embodiment, the resulting construction includes four subcells, with band gaps in the range of 1.8 to 2.1 eV, 1.3 to 1.5 eV, 0.9 to 1.1 eV, and 0.6 to 0.8 eV respectively.

It should be apparent to one skilled in the art that in addition to the two different metamorphic layers discussed in the present disclosure, additional types of semiconductor layers within the cell are also within the scope of the present invention.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

FIG. 1 is a graph representing the band gap of certain binary materials and their lattice constants. The band gap and lattice constants of ternary materials are located on the lines drawn between typical associated binary materials (such as the ternary material AlGaAs being located between the GaAs and AlAs points on the graph, with the band gap of the ternary material lying between 1.42 eV for GaAs and 2.16 eV for AlAs depending upon the relative amount of the individual constituents). Thus, depending upon the desired band gap, the material constituents of ternary materials can be appropriately selected for growth.

The lattice constants and electrical properties of the layers in the semiconductor structure are preferably controlled by specification of appropriate reactor growth temperatures and times, and by use of appropriate chemical composition and dopants. The use of a vapor deposition method, such as Organo Metallic Vapor Phase Epitaxy (OMVPE), Metal Organic Chemical Vapor Deposition (MOCVD), Molecular Beam Epitaxy (MBE), or other vapor deposition methods for the reverse growth may enable the layers in the monolithic semiconductor structure forming the cell to be grown with the required thickness, elemental composition, dopant concentration and grading and conductivity type.

The present disclosure is directed to a growth process using a metal organic chemical vapor deposition (MOCVD) process in a standard, commercially available reactor suitable for high volume production. More particularly, the present disclosure is directed to the materials and fabrication steps that are particularly suitable for producing commercially viable inverted metamorphic multijunction solar cells using commercially available equipment and established high-volume fabrication processes, as contrasted with merely academic expositions of laboratory or experimental results.

The present disclosure is directed to a growth process using a metal organic chemical vapor deposition (MOCVD) process in a standard, commercially available reactor suitable for high volume production. More particularly, the present disclosure is directed to the materials and fabrication steps that are particularly suitable for producing commercially viable inverted metamorphic multijunction solar cells using commercially available equipment and established high-volume fabrication processes, as contrasted with merely academic expositions of laboratory or experimental results. The thickness of the epitaxial layers forming the inverted metamorphic multijunction solar cells disclosed in the present and related applications noted above are 12 microns or more. The thickness of the graded metamorphic buffer layer may be from 2.5 to 3.0 microns. The time required to grow such epitaxial layers is a significant factor which distinguishes a high volume commercial MOCVD process from processes using MBE growth, for example. Currently available MBE systems require about one hour to grow one micron of epitaxial material. Thus, the growth of a graded metamorphic buffer layer may take as long as three hours in an MBE system. By contrast, the growth of the same structure using an MOCVD process can take less than 45 minutes.

It should incidentally be noted that the layers with a certain target composition in a semiconductor structure grown in an MOCVD process are inherently physically different than the layers of an identical target composition grown by another process, e.g. Molecular Beam Epitaxy (MBE). The material quality (i.e., morphology, stoichiometry, number and location of lattice traps, impurities, and other lattice defects) of an epitaxial layer in a semiconductor structure is different depending upon the process used to grow the layer, as well as the process parameters associated with the growth. MOCVD is inherently a chemical reaction process, while MBE is a physical deposition process. The chemicals used in the MOCVD process are present in the MOCVD reactor and interact with the wafers in the reactor, and affect the composition, doping, and other physical, optical and electrical characteristics of the material. For example, the precursor gases used in an MOCVD reactor (e.g. hydrogen) are incorporated into the resulting processed wafer material, and have certain identifiable electro-optical consequences which are more advantageous in certain specific applications of the semiconductor structure, such as in photoelectric conversion in structures designed as solar cells. Such high order effects of processing technology do result in relatively minute but actually observable differences in the material quality grown or deposited according to one process technique compared to another. Thus, devices fabricated at least in part using an MOCVD reactor or using a MOCVD process have inherent different physical material characteristics, which may have an advantageous effect over the identical target material deposited using alternative processes.

The lattice constants and electrical properties of the layers in the semiconductor structure are preferably controlled by specification of appropriate reactor growth temperatures and times, and by use of appropriate chemical composition and dopants. The use of a vapor deposition method, such as Organo Metallic Vapor Phase Epitaxy (OMVPE), Metal Organic Chemical Vapor Deposition (MOCVD), or other vapor deposition methods for the reverse growth may enable the layers in the monolithic semiconductor structure forming the cell to be grown with the required thickness, elemental composition, dopant concentration and grading and conductivity type.

Figure 2:
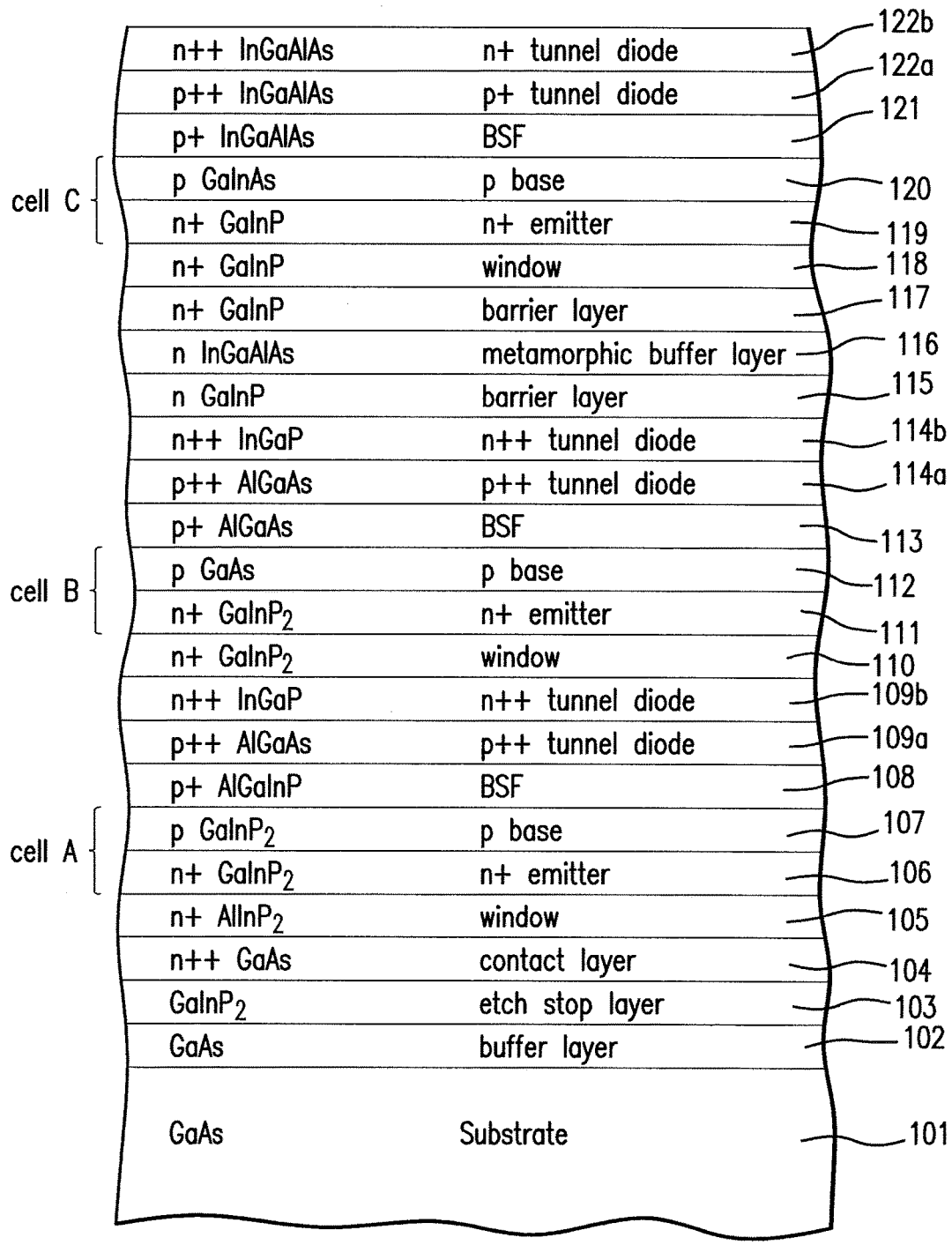
FIG. 2 is a cross-sectional view of the solar cell of the present invention after an initial stage of fabrication including the deposition of certain semiconductor layers on the growth substrate.

FIG. 2 depicts the multijunction solar cell according to the present invention after the sequential formation of the three subcells A, B and C on a GaAs growth substrate. More particularly, there is shown a substrate 101, which is preferably gallium arsenide (GaAs), but may also be germanium (Ge) or other suitable material. For GaAs, the substrate is preferably a 15° off-cut substrate, that is to say, its surface is orientated 15° off the (100) plane towards the (111)A plane, as more fully described in U.S. patent application Ser. No. 12/047,944, filed Mar. 13, 2008.

In the case of a Ge substrate, a nucleation layer (not shown) is deposited directly on the substrate 101. On the substrate, or over the nucleation layer (in the case of a Ge substrate), a buffer layer 102 and an etch stop layer 103 are further deposited. In the case of GaAs substrate, the buffer layer 102 is preferably GaAs. In the case of Ge substrate, the buffer layer 102 is preferably InGaAs. A contact layer 104 of GaAs is then deposited on layer 103, and a window layer 105 of AlInP is deposited on the contact layer. The subcell A, consisting of an n+ emitter layer 106 and a p-type base layer 107, is then epitaxially deposited on the window layer 105. The subcell A is generally latticed matched to the growth substrate 101.

It should be noted that the multijunction solar cell structure could be formed by any suitable combination of group III to V elements listed in the periodic table subject to lattice constant and bandgap requirements, wherein the group III includes boron (B), aluminum (Al), gallium (Ga), indium (In), and thallium (T). The group IV includes carbon (C), silicon (Si), germanium (Ge), and tin (Sn). The group V includes nitrogen (N), phosphorous (P), arsenic (As), antimony (Sb), and bismuth (Bi).

In the preferred embodiment, the emitter layer 106 is composed of InGa(Al)P and the base layer 107 is composed of InGa(Al)P. The aluminum or Al term in parenthesis in the preceding formula means that Al is an optional constituent, and in this instance may be used in an amount ranging from 0% to 30%. The doping profile of the emitter and base layers 106 and 107 according to the present invention will be discussed in conjunction with FIG. 20.

Subcell A will ultimately become the "top" subcell of the inverted metamorphic structure after completion of the process steps according to the present invention to be described hereinafter.

On top of the base layer 107 a back surface field ("BSF") layer 108 preferably p+ AlGaInP is deposited and used to reduce recombination loss.

The BSF layer 108 drives minority carriers from the region near the base/BSF interface surface to minimize the effect of recombination loss. In other words, a BSF layer 18 reduces recombination loss at the backside of the solar subcell A and thereby reduces the recombination in the base.

On top of the BSF layer 108 is deposited a sequence of heavily doped p-type and n-type layers 109a and 109b that forms a tunnel diode, i.e. an ohmic circuit element that connects subcell A to subcell B. Layer 109a is preferably composed of p++ AlGaAs, and layer 109b is preferably composed of n++ InGaP.

On top of the tunnel diode layers 109 a window layer 110 is deposited, preferably n+ InGaP. The advantage of utilizing InGaP as the material constituent of the window layer 110 is that it has an index of refraction that closely matches the adjacent emitter layer 111, as more fully described in U.S. patent application Ser. No. 12/258,190, filed Oct. 24, 2008. The window layer 110 used in the subcell B also operates to reduce the interface recombination loss. It should be apparent to one skilled in the art, that additional layer(s) may be added or deleted in the cell structure without departing from the scope of the present invention.

On top of the window layer 110 the layers of subcell B are deposited: the n-type emitter layer 111 and the p-type base layer 112. These layers are preferably composed of InGaP and $In_{0.015}GaAs$ respectively (for a Ge substrate or growth template), or InGaP and GaAs respectively (for a GaAs substrate), although any other suitable materials consistent with lattice constant and bandgap requirements may be used as well. Thus, subcell B may be composed of a GaAs, GaInP, GaInAs, GaAsSb, or GaInAsN emitter region and a GaAs, GaInAs, GaAsSb, or GaInAsN base region. The doping profile of layers 111 and 112 according to the present invention will be discussed in conjunction with FIG. 20.

In previously disclosed implementations of an inverted metamorphic solar cell, the middle cell was a homostructure. In the present invention, similarly to the structure disclosed in U.S. patent application Ser. No. 12/023,772, the middle subcell becomes a heterostructure with an InGaP emitter and its window is converted from InAlP to InGaP. This modification eliminated the refractive index discontinuity at the window/emitter interface of the middle subcell, as more fully described in U.S. patent application Ser. No. 12/258,190, filed Oct. 24, 2008. Moreover, the window layer 110 is preferably doped three times that of the emitter 111 to move the Fermi level up closer to the conduction band and therefore create band bending at the window/emitter interface which results in constraining the minority carriers to the emitter layer.

In the preferred embodiment of the present invention, the middle subcell emitter has a band gap equal to the top subcell emitter, and the third subcell emitter has a band gap greater than the band gap of the base of the middle subcell. Therefore, after fabrication of the solar cell, and implementation and operation, neither the emitters of middle subcell B nor the third subcell C will be exposed to absorbable radiation. Substantially all of the photons representing absorbable radiation will be absorbed in the bases of cells B and C, which have narrower band gaps then the emitters. Therefore, the advantages of using heterojunction subcells are: (i) the short wavelength response for both subcells will improve, and (ii) the bulk of the radiation is more effectively absorbed and collected in the narrower band gap base. The effect will be to increase $J_{sc}$.

On top of the cell B is deposited a BSF layer 113 which performs the same function as the BSF layer 109. The p++/n++ tunnel diode layers 114a and 114b respectively are deposited over the BSF layer 113, similar to the layers 109a and 109b, forming an ohmic circuit element to connect subcell B to subcell C. The layer 114a is preferably composed of p++ AlGaAs, and layer 114b is preferably composed of n++ InGaP.

A barrier layer 115, preferably composed of n-type InGa(Al)P, is deposited over the tunnel diode 114a/114b, to a thickness of about 1.0 micron. Such barrier layer is intended to prevent threading dislocations from propagating, either opposite to the direction of growth into the middle and top subcells B and C, or in the direction of growth into the bottom subcell A, and is more particularly described in copending U.S. patent application Ser. No. 11/860,183, filed Sep. 24, 2007.

A metamorphic layer (or graded interlayer) 116 is deposited over the barrier layer 115 using a surfactant. Layer 116 is preferably a compositionally step-graded series of InGaAlAs layers, preferably with monotonically changing lattice constant, so as to achieve a gradual transition in lattice constant in the semiconductor structure from subcell B to subcell C while minimizing threading dislocations from occurring. The band gap of layer 116 is constant throughout its thickness, preferably approximately equal to 1.5 eV, or otherwise consistent with a value slightly greater than the bandgap of the middle subcell B. The preferred embodiment of the graded interlayer may also be expressed as being composed of $(In_xGa_{1-x})_yAl_{1-y}As$, with x and y selected such that the band gap of the interlayer remains constant at approximately 1.50 eV or other appropriate band gap.

In an alternative embodiment where the solar cell has only two subcells, and the "middle" cell B is the uppermost or top subcell in the final solar cell, wherein the "top" subcell B would typically have a bandgap of 1.8 to 1.9 eV, then the band gap of the interlayer would remain constant at 1.9 eV.

In the inverted metamorphic structure described in the Wanlass et al. paper cited above, the metamorphic layer consists of nine compositionally graded InGaP steps, with each step layer having a thickness of 0.25 micron. As a result, each layer of Wanlass et al. has a different bandgap. In the preferred embodiment of the present invention, the layer 116 is composed of a plurality of layers of InGaAlAs, with monotonically changing lattice constant, each layer having the same band gap, approximately 1.5 eV.

The advantage of utilizing a constant bandgap material such as InGaAlAs is that arsenide-based semiconductor material is much easier to process in standard commercial MOCVD reactors, while the small amount of aluminum assures radiation transparency of the metamorphic layers.

Although the preferred embodiment of the present invention utilizes a plurality of layers of InGaAlAs for the metamorphic layer 116 for reasons of manufacturability and radiation transparency, other embodiments of the present invention may utilize different material systems to achieve a change in lattice constant from subcell B to subcell C. Thus, the system of Wanlass using compositionally graded InGaP is a second embodiment of the present invention. Other embodiments of the present invention may utilize continuously graded, as opposed to step graded, materials. More generally, the graded interlayer may be composed of any of the As, P, N, Sb based III-V compound semiconductors subject to the constraints of having the in-plane lattice parameter greater or equal to that of the second solar cell and less than or equal to that of the third solar cell, and having a bandgap energy greater than that of the second solar cell.

In another embodiment of the present invention, an optional second barrier layer 117 may be deposited over the InGaAlAs metamorphic layer 116. The second barrier layer 117 will typically have a different composition than that of barrier layer 115, and performs essentially the same function of preventing threading dislocations from propagating. In the preferred embodiment, barrier layer 117 is n+ type GaInP.

A window layer 118 preferably composed of n+ type GaInP is then deposited over the barrier layer 117 (or directly over layer 116, in the absence of a second barrier layer). This window layer operates to reduce the recombination loss in subcell "C". It should be apparent to one skilled in the art that additional layers may be added or deleted in the cell structure without departing from the scope of the present invention.

On top of the window layer 118, the layers of cell C are deposited: the n+ emitter layer 119, and the p-type base layer 120. These layers are preferably composed of n+ type InGaAs and p+ type InGaAs respectively, or n+ type InGaP and p type InGaAs for a heterojunction subcell, although another suitable materials consistent with lattice constant and bandgap requirements may be used as well. The doping profile of layers 119 and 120 will be discussed in connection with FIG. 20.

A BSF layer 121, preferably composed of InGaAlAs, is then deposited on top of the cell C, the BSF layer performing the same function as the BSF layers 108 and 113.

The p++/n++ tunnel diode layers 122a and 122b respectively are deposited over the BSF layer 121, similar to the layers 114a and 114b, forming an ohmic circuit element to connect subcell C to subcell D. The layer 122a is preferably composed of p++ InGaAlAs, and layer 122b is preferably composed of n++ InGaAlAs.

Figure 3:
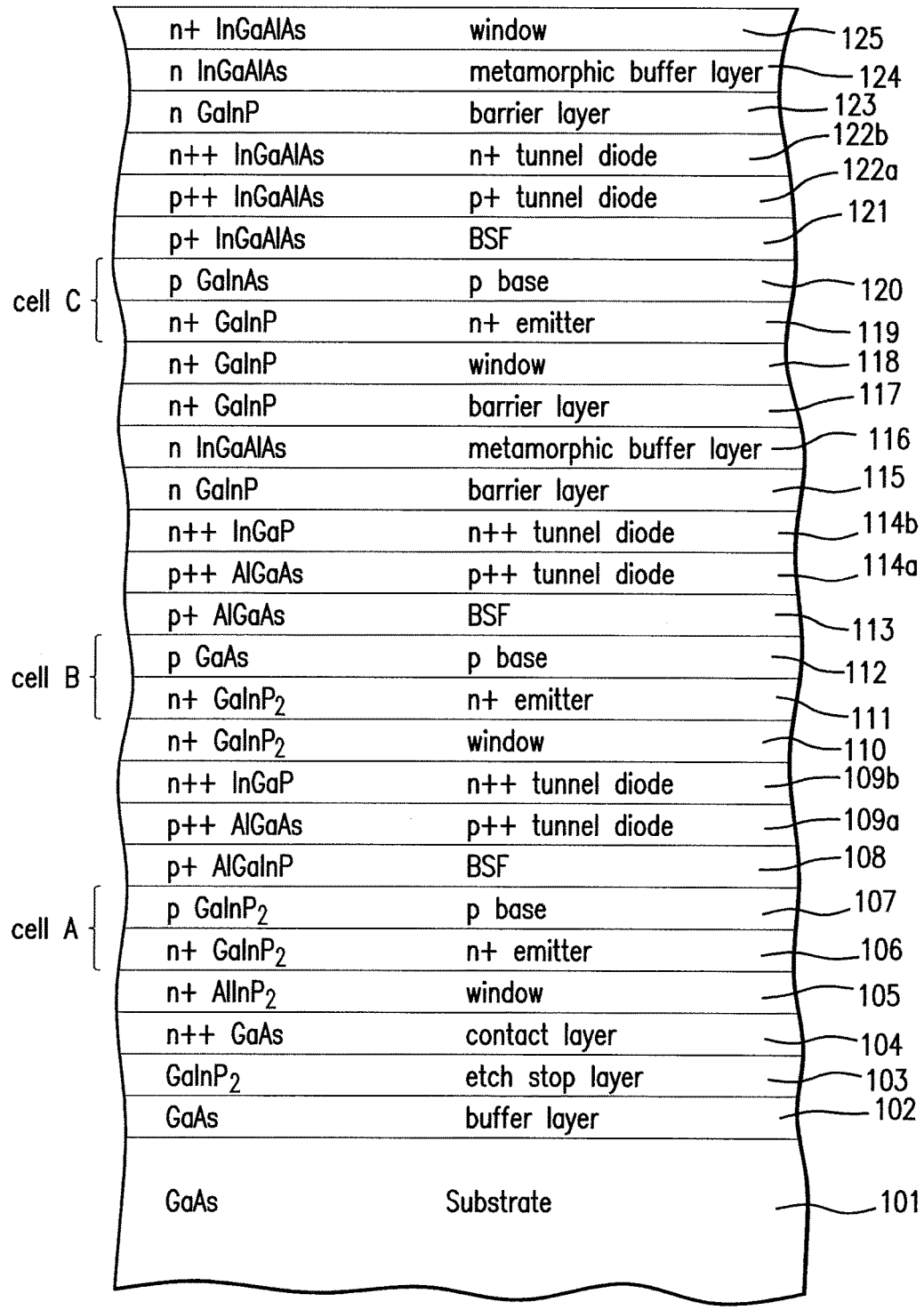
FIG. 3 is a cross-sectional view of the solar cell of FIG. 2 after the next sequence of process steps.

FIG. 3 depicts a cross-sectional view of the solar cell of FIG. 2 after the next sequence of process steps. A barrier layer 123, preferably composed of n-type GaInP, is deposited over the tunnel diode 122a/122b, to a thickness of about 1.0 micron. Such barrier layer is intended to prevent threading dislocations from propagating, either opposite to the direction of growth into the top and middle subcells A, B and C, or in the direction of growth into the subcell D, and is more particularly described in copending U.S. patent application Ser. No. 11/860,183, filed Sep. 24, 2007.

A metamorphic layer (or graded interlayer) 124 is deposited over the barrier layer 123 using a surfactant. Layer 124 is preferably a compositionally step-graded series of InGaAlAs layers, preferably with monotonically changing lattice constant, so as to achieve a gradual transition in lattice constant in the semiconductor structure from subcell C to subcell D while minimizing threading dislocations from occurring. The band gap of layer 124 is constant throughout its thickness, preferably approximately equal to 1.1 eV, or otherwise consistent with a value slightly greater than the band gap of the middle subcell C. The preferred embodiment of the graded interlayer may also be expressed as being composed of $(In_xGa_{1-x})_yAl_{1-y}As$, with x and y selected such that the band gap of the interlayer remains constant at approximately 1.1 eV or other appropriate band gap.

A window layer 125 preferably composed of n+ type InGaAlAs is then deposited over layer 124 (or over a second barrier layer, if there is one, disposed over layer 124). This window layer operates to reduce the recombination loss in the fourth subcell "D". It should be apparent to one skilled in the art that additional layers may be added or deleted in the cell structure without departing from the scope of the present invention.

Figure 4:
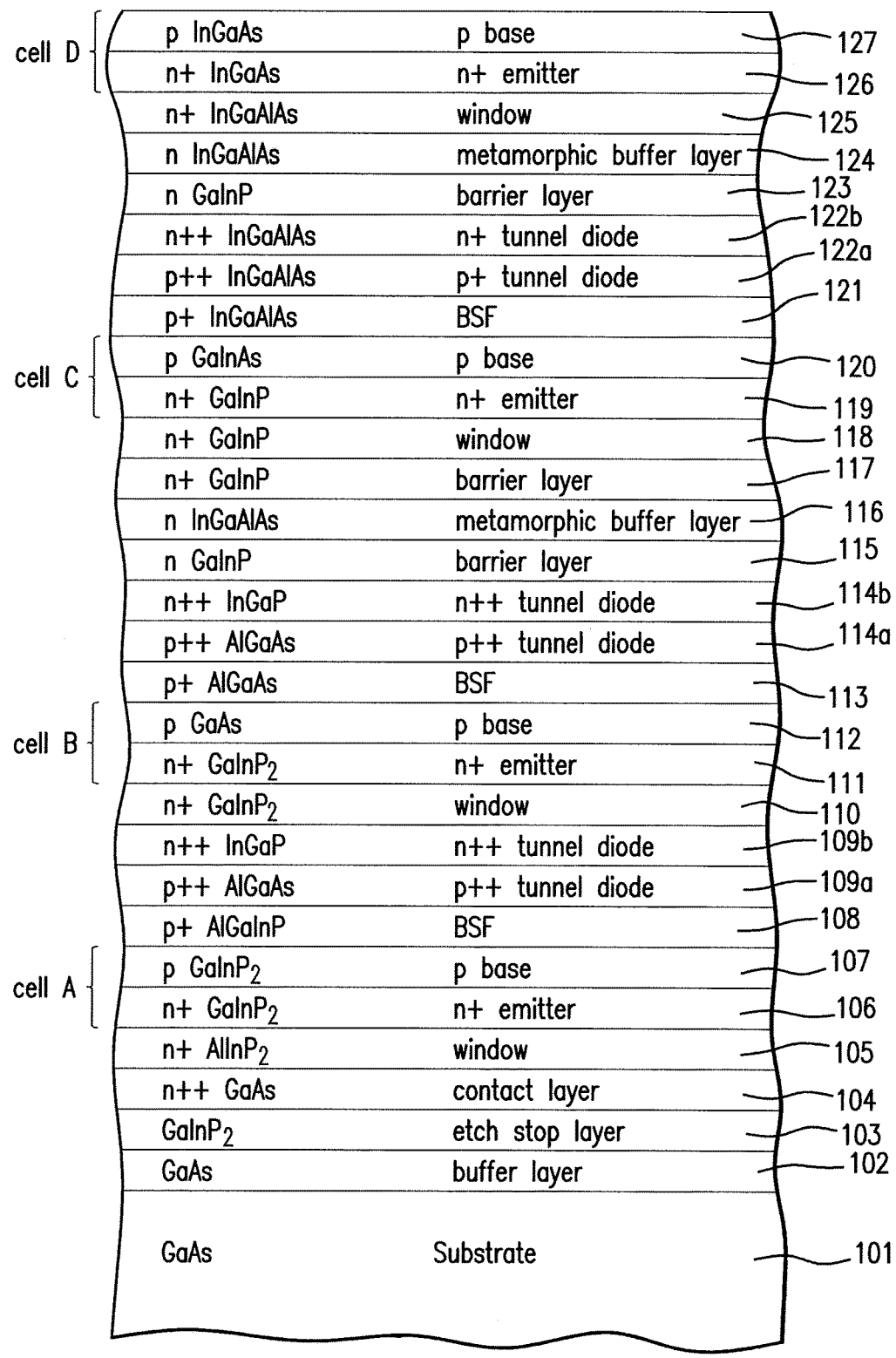
FIG. 4 is a cross-sectional view of the solar cell of FIG. 3 after the next sequence of process steps.

FIG. 4 depicts a cross-sectional view of the solar cell of FIG. 3 after the next sequence of process steps. On top of the window layer 125, the layers of cell D are deposited: the n+ emitter layer 126, and the p-type base layer 127. These layers are preferably composed of n+ type InGaAs and p type InGaAs respectively, or n+ type InGaP and p type InGaAs for a heterojunction subcell, although another suitable materials consistent with lattice constant and bandgap requirements may be used as well. The doping profile of layers 126 and 127 will be discussed in connection with FIG. 20.

Figure 5:
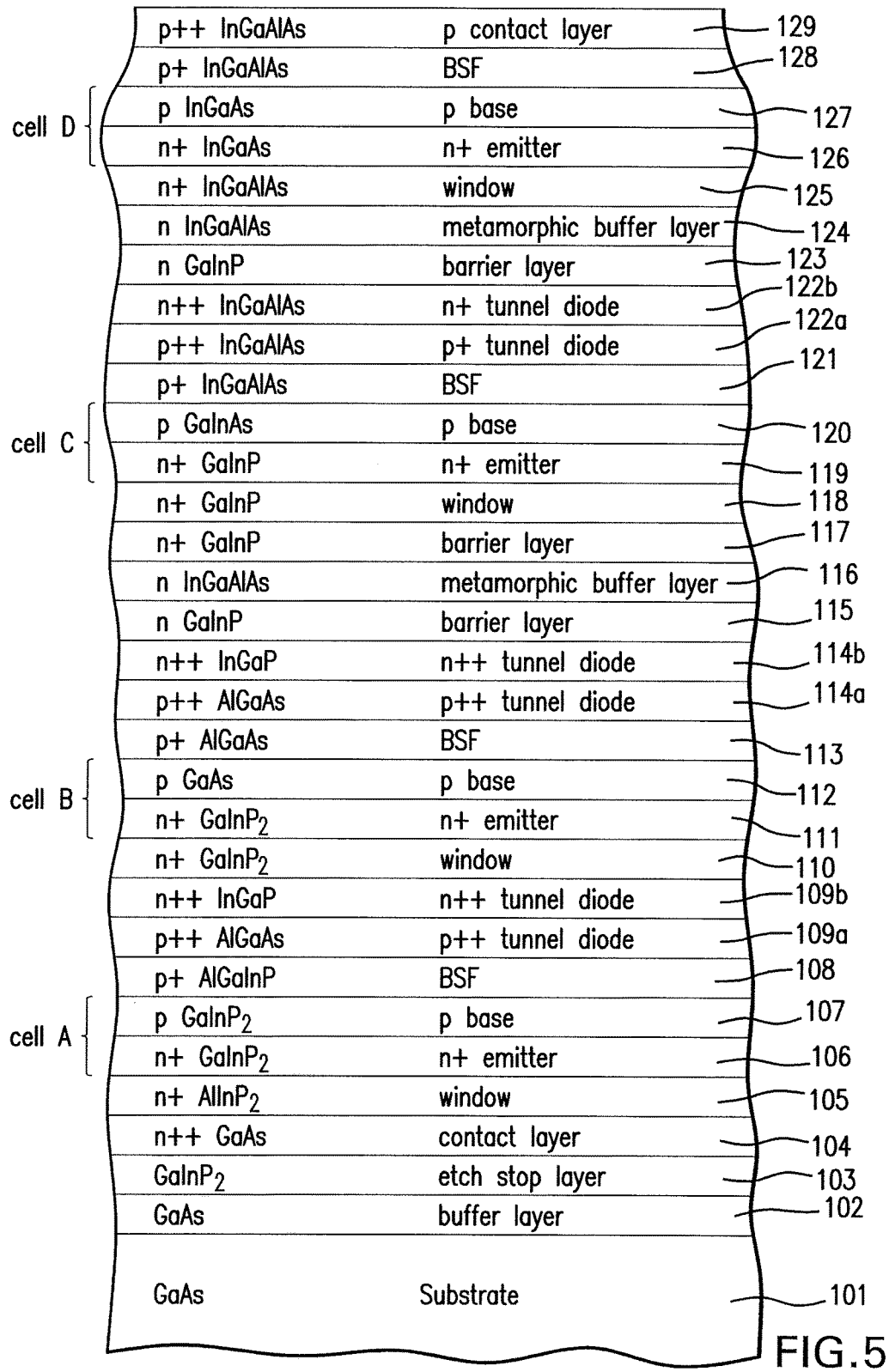
FIG. 5 is a cross-sectional view of the solar cell of FIG. 4 after the next sequence of process steps.

Turning next to FIG. 5, A BSF layer 128, preferably composed of p+ type InGaAlAs, is then deposited on top of the cell D, the BSF layer performing the same function as the BSF layers 108, 113 and 121.

Finally a high band gap contact layer 129, preferably composed of p++ type InGaAlAs, is deposited on the BSF layer 128.

The composition of this contact layer 129 located at the bottom (non-illuminated) side of the lowest band gap photovoltaic cell (i.e., subcell "D" in the depicted embodiment) in a multijunction photovoltaic cell, can be formulated to reduce absorption of the light that passes through the cell, so that (i) the backside ohmic metal contact layer below it (on the non-illuminated side) will also act as a mirror layer, and (ii) the contact layer doesn't have to be selectively etched off, to prevent absorption.

It should be apparent to one skilled in the art, that additional layer(s) may be added or deleted in the cell structure without departing from the scope of the present disclosure.

Figure 6:
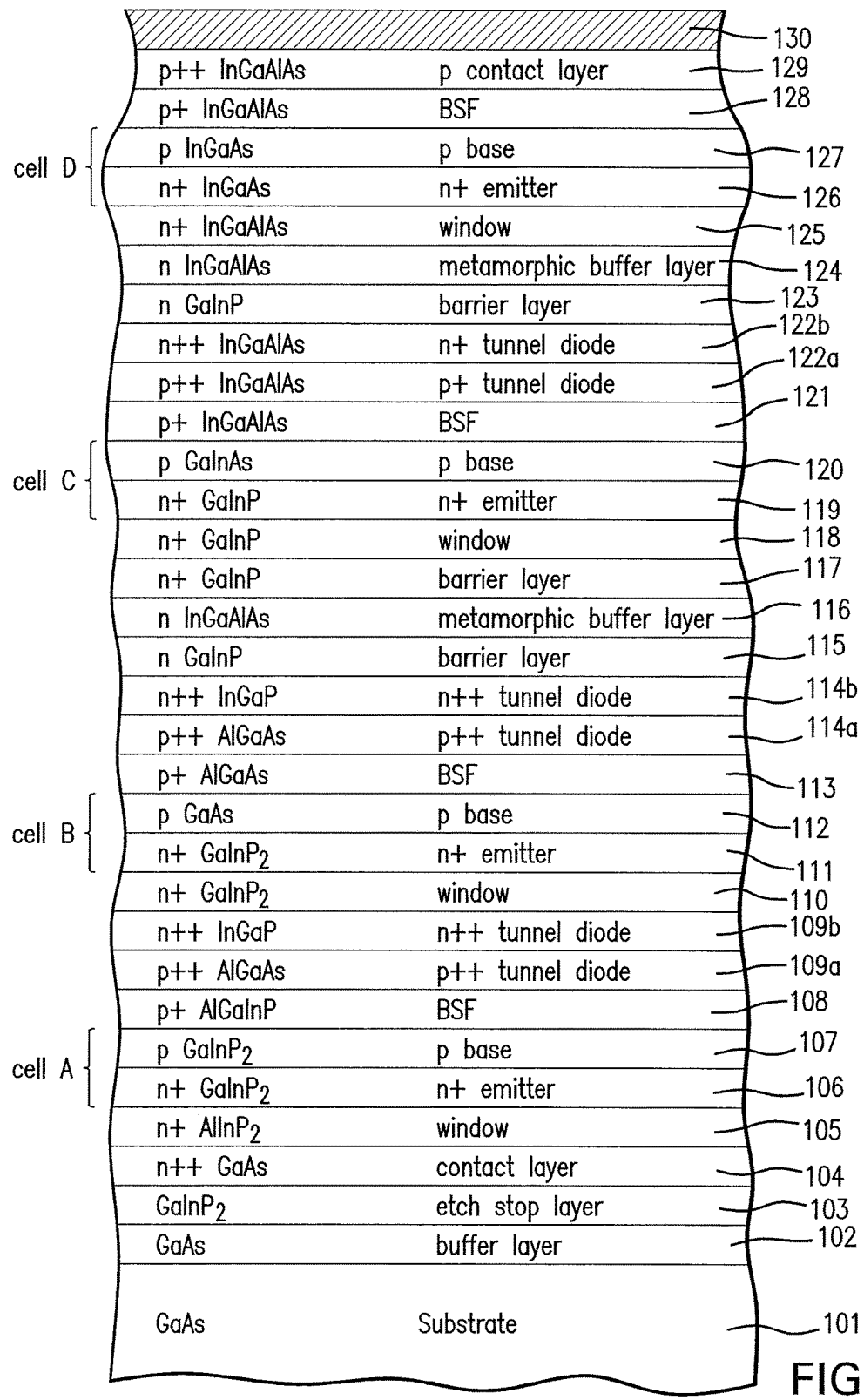
FIG. 6 is a cross-sectional view of the solar cell of FIG. 5 after the next process step.

FIG. 6 is a cross-sectional view of the solar cell of FIG. 5 after the next process step in which a metal contact layer 123 is deposited over the p+ semiconductor contact layer 122. The metal is preferably the sequence of metal layers Ti/Au/Ag/Au.

Also, the metal contact scheme chosen is one that has a planar interface with the semiconductor, after heat treatment to activate the ohmic contact. This is done so that (1) a dielectric layer separating the metal from the semiconductor doesn't have to be deposited and selectively etched in the metal contact areas; and (2) the contact layer is specularly reflective over the wavelength range of interest.

Figure 7:
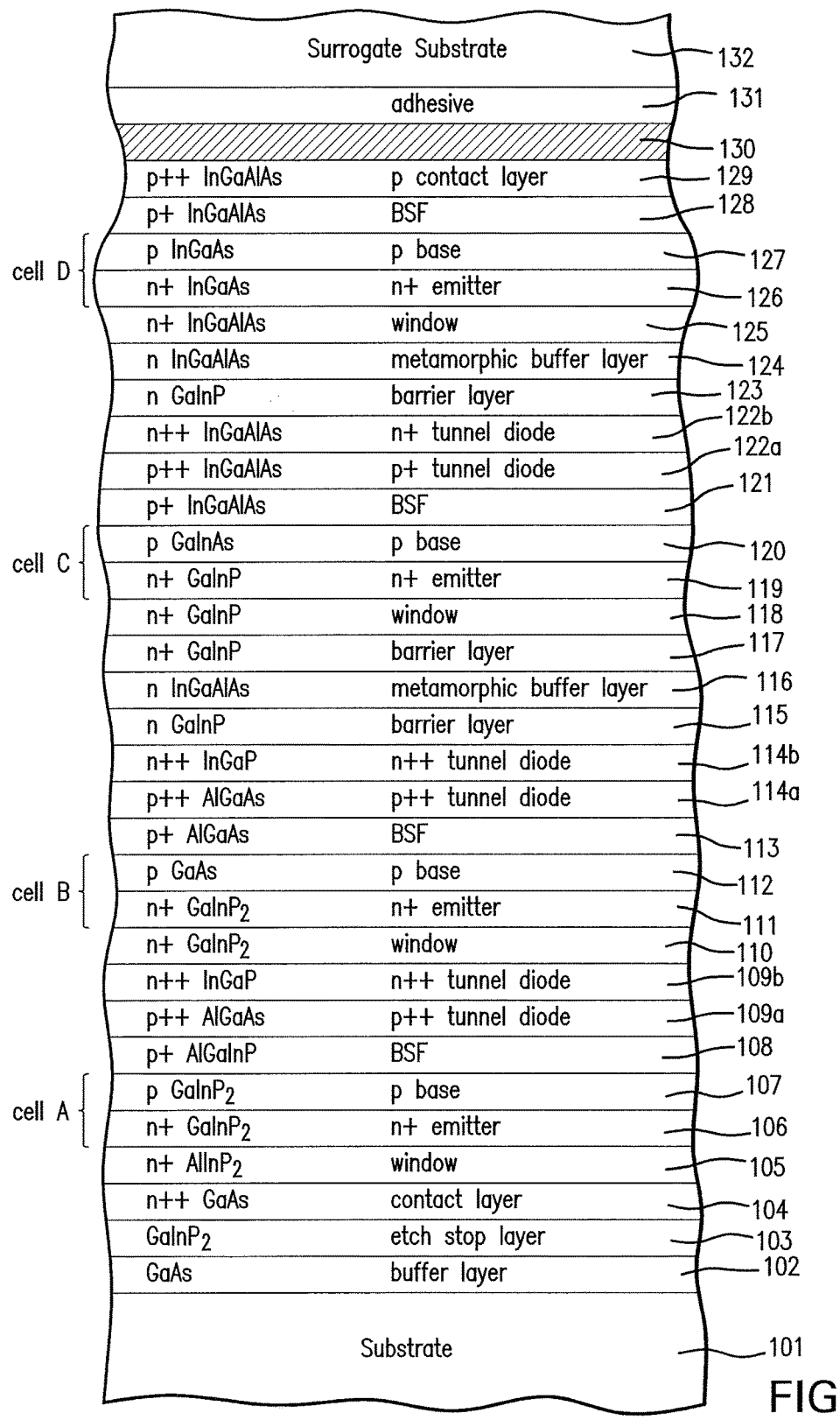
FIG. 7 is a cross-sectional view of the solar cell of FIG. 6 after the next process step in which a surrogate substrate is attached.

FIG. 7 is a cross-sectional view of the solar cell of FIG. 3 after the next process step in which an adhesive layer 131 is deposited over the metal layer 130. In some embodiments, the adhesive may be Wafer Bond (manufactured by Brewer Science, Inc. of Rolla, Mo.).

In the next process step, a surrogate substrate 132, in some embodiments composed of sapphire, is attached. Alternative, the surrogate substrate may be GaAs, Ge or Si, or other suitable material. The surrogate substrate is about 40 mils in thickness, and is perforated with holes about 1 mm in diameter, spaced 4 mm apart, to aid in subsequent removal of the adhesive and the substrate. As an alternative to using an adhesive layer 131, a suitable substrate (e.g., GaAs) may be eutectically or permanently bonded to the metal layer 130.

Figure 8A:
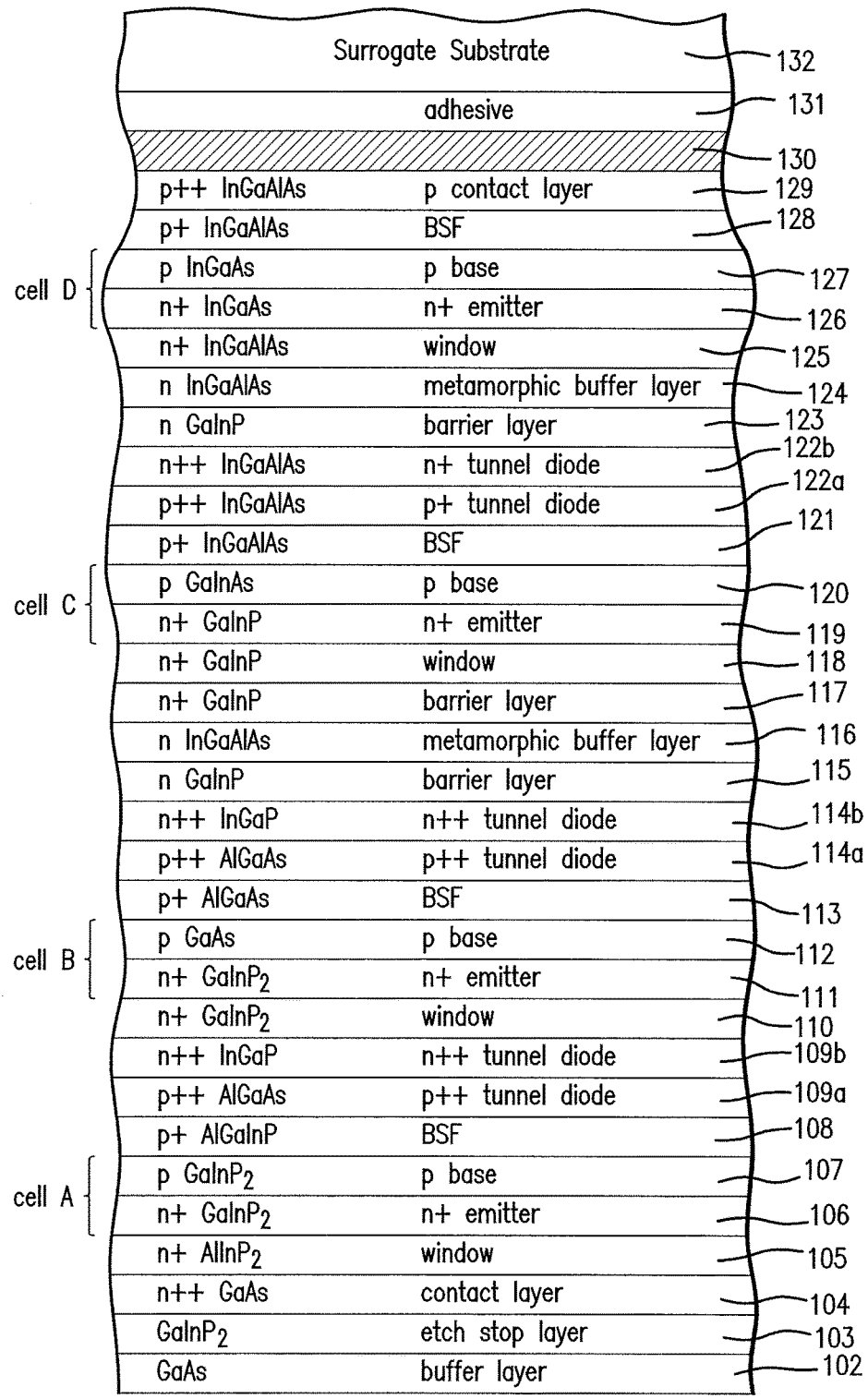
FIG. 8A is a cross-sectional view of the solar cell of FIG. 7 after the next process step in which the original substrate is removed.

FIG. 8A is a cross-sectional view of the solar cell of FIG. 7 after the next process step in which the original substrate is removed by a sequence of lapping and/or etching steps in which the substrate 101, and the buffer layer 103 are removed. The choice of a particular etchant is growth substrate dependent.

Figure 8B:
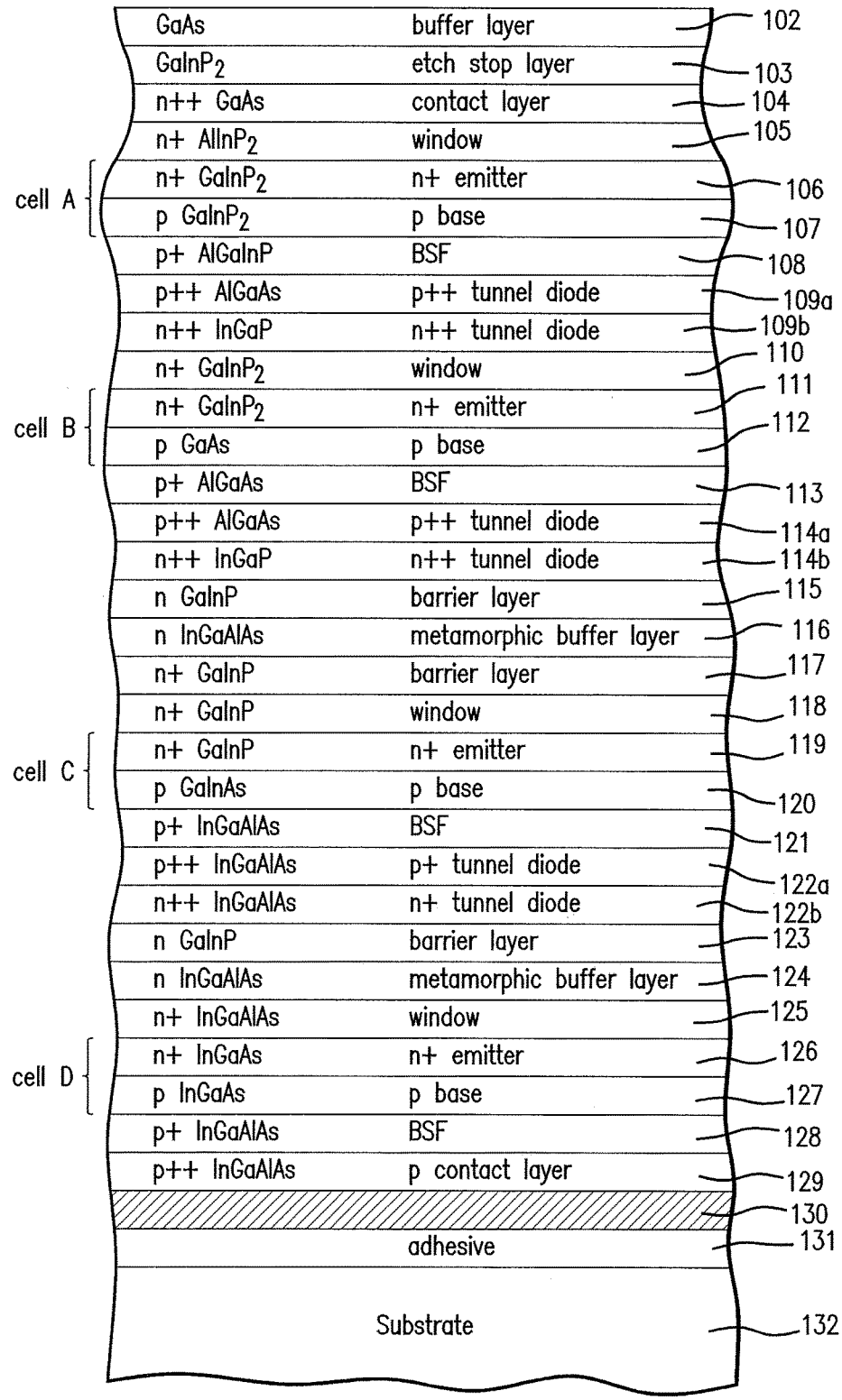
FIG. 8B is another cross-sectional view of the solar cell of FIG. 8A with the surrogate substrate on the bottom of the Figure.

FIG. 8B is a cross-sectional view of the solar cell of FIG. 8A with the orientation with the surrogate substrate 132 being at the bottom of the Figure. Subsequent Figures in this application will assume such orientation.

Figure 9:
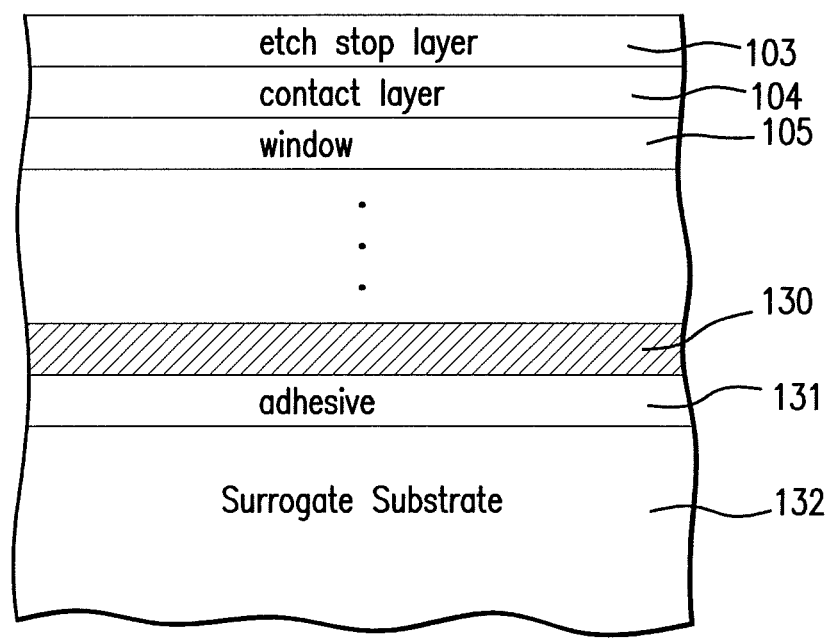
FIG. 9 is a simplified cross-sectional view of the solar cell of FIG. 8B after the next process step.

FIG. 9 is a simplified cross-sectional view of the solar cell of FIG. 8B depicting just a few of the top layers and lower layers over the surrogate substrate 132.

Figure 10:
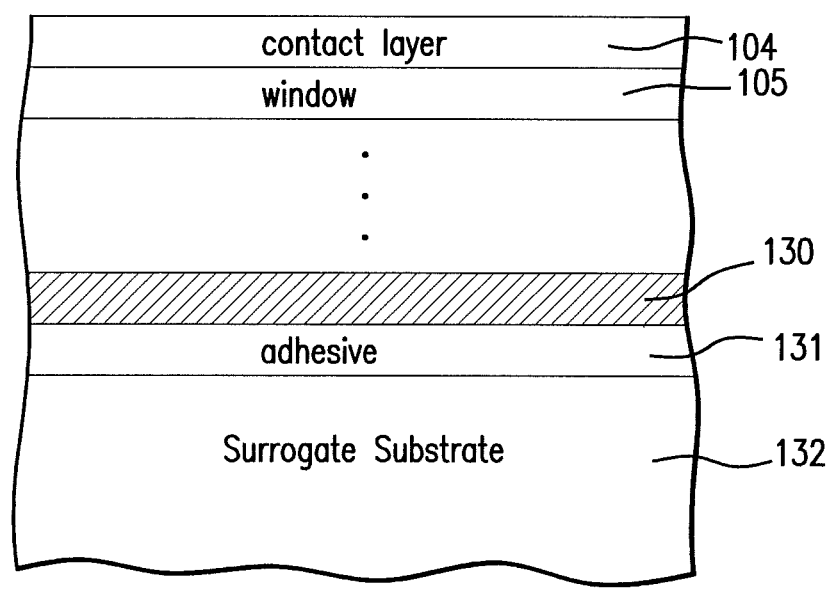
FIG. 10 is a cross-sectional view of the solar cell of FIG. 9 after the next process step.

FIG. 10 is a cross-sectional view of the solar cell of FIG. 9 after the next process step in which the etch stop layer 103 is removed by a HCl/H$_2$O solution.

Figure 11:
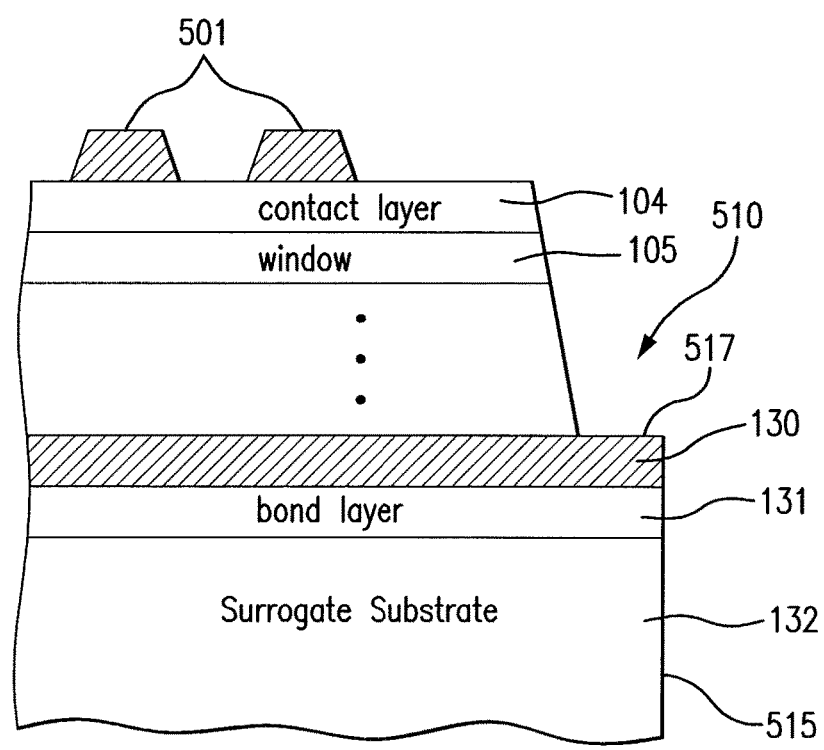
FIG. 11 is a cross-sectional view of the solar cell of FIG. 10 after the next process step.

FIG. 11 is a cross-sectional view of the solar cell of FIG. 10 after the next sequence of process steps in which a photoresist mask (not shown) is placed over the contact layer 104 to form the grid lines 501. As will be described in greater detail below, the grid lines 501 are deposited via evaporation and lithographically patterned and deposited over the contact layer 104. The mask is subsequently lifted off to form the finished metal grid lines 501 as depicted in the Figures. A trench or channel 510, or portion of the semiconductor structure, is then etched around each of the solar cells down to the metal surface 517 of the metal layer 130. These channels define a peripheral boundary between the solar cell (later to be scribed from the wafer) and the rest of the wafer, and leaves a mesa structure (or a plurality of mesas, in the case of more than one solar cell per wafer) which define and constitute the solar cells later to be scribed and diced from the wafer. In FIG. 11, the peripheral edge of a solar cell is depicted so that 515 is the edge of the wafer (on one side), or where the solar cell is to be scribed from the wafer, on the other side, As more fully described in U.S. patent application Ser. No. 12/218,582 filed Jul. 18, 2008, hereby incorporated by reference, the grid lines 501 are preferably composed of Pd/Ge/Ti/Pd/Au, although other suitable materials may be used as well.

Figure 12A:
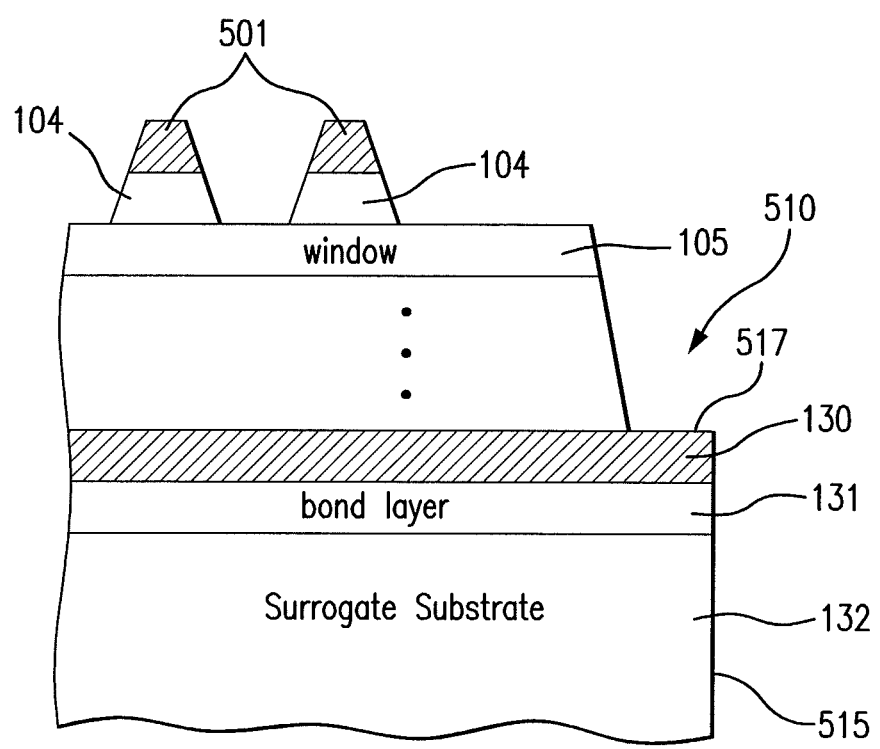
FIG. 12A is a cross-sectional view of the solar cell of FIG. 11 after the next process step.

FIG. 12A is a cross-sectional view of the solar cell of FIG. 11 after the next process step in which the grid lines are used as a mask to etch down the surface to the window layer 105 using a citric acid/peroxide etching mixture. The cross-section depicted in FIG. 12A is that as seen from the A-A plane shown in FIG. 13A.

Figure 12B:
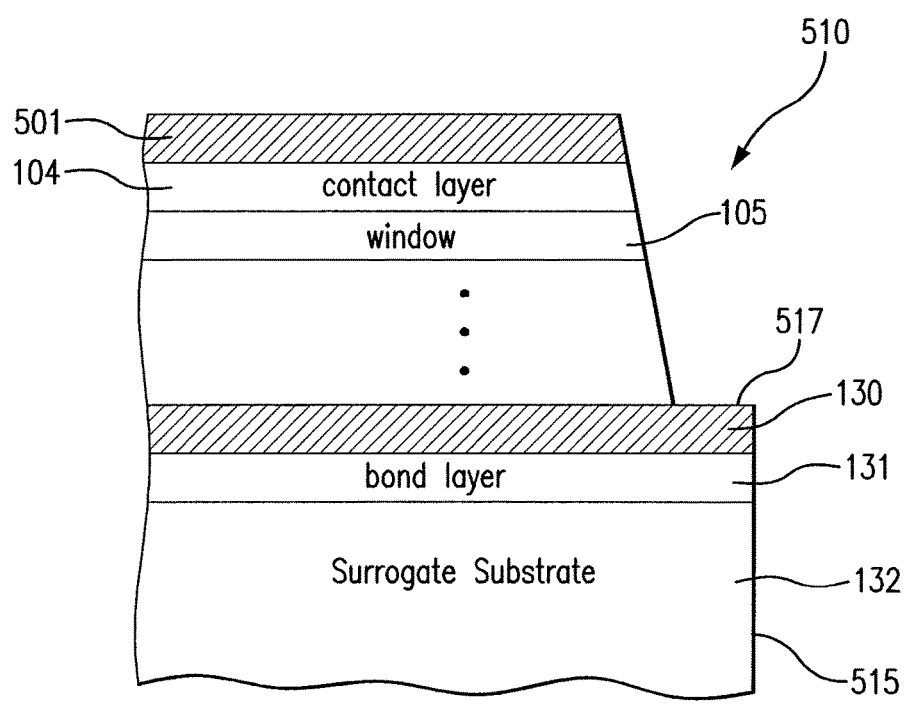
FIG. 12B is a cross-sectional view of the solar cell of FIG. 12A after the next process step.

FIG. 12B is a cross-sectional view of the solar cell of FIG. 12A taken parallel to one of the grid lines 501.

Figure 12C:
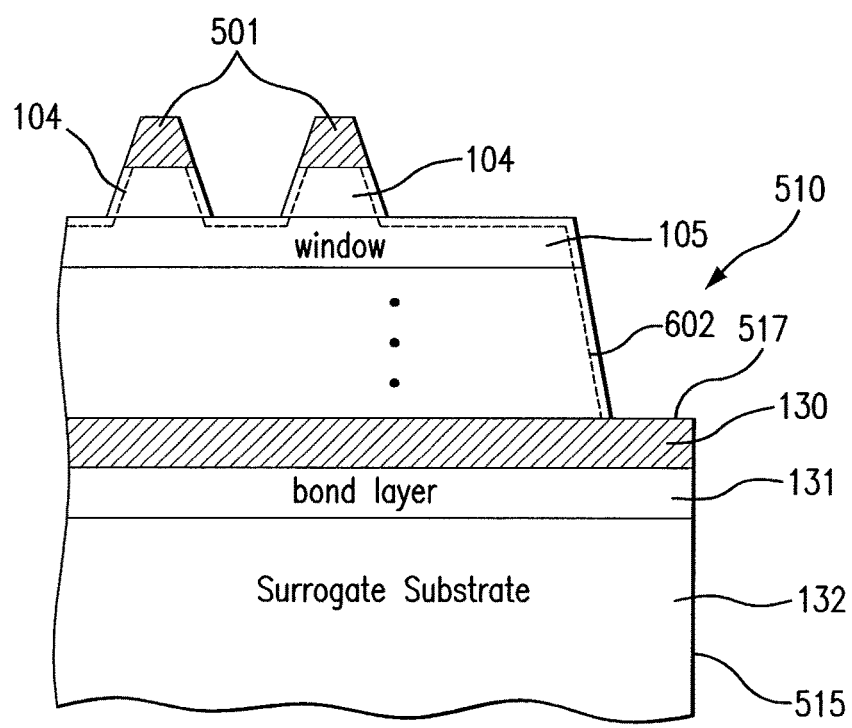
FIG. 12C is a cross-sectional view of the solar cell of FIG. 12B after the next process step.

FIG. 12C is a cross-sectional view of the solar cell of FIG. 12A after the next process step in which the entire wafer is dipped in a solution of ammonium sulphide for a period of time at least 15 minutes. In other embodiments, the period of time may be longer depending upon the concentration of the solution. In other embodiments, the passivation of the surface may be performed by exposure to a hydrogen sulfide gas. The passivized surface is represented in the FIG. 12C by dots 602 penetrating into the exposed surface of the window layer 105 and the exposed edge layers of the wafer.

Figure 12D:
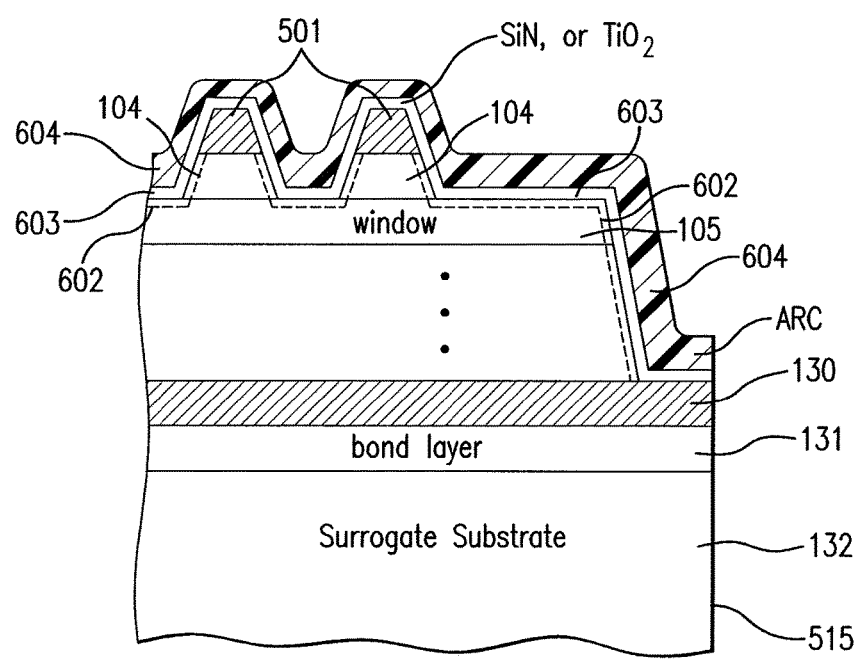
FIG. 12D is a cross-sectional view of the solar cell of FIG. 12C after the next process step.

FIG. 12D is a cross-sectional view of the solar cell of FIG. 12B after the next process steps in which a layer 603 of silicon nitride or titanium dioxide, generally from 50 to 100 Angstroms in thickness, is deposited by plasma enhanced chemical vapor deposition. The deposition of the layer 603 should take place reasonably soon after the passivation step, e.g. after a period of time no longer than sixty minutes, to ensure the quality of the surface of the wafer. In other embodiments, the layer 603 may be deposited by other techniques known in the art, including sputtering and/or evaporation of silicon nitride or titanium dioxide. After deposition of the layer 603, an antireflection coating layer 604 is deposited in a thickness of 800 to 1000 Angstroms over the entire top surface of the wafer.

Figure 12E:
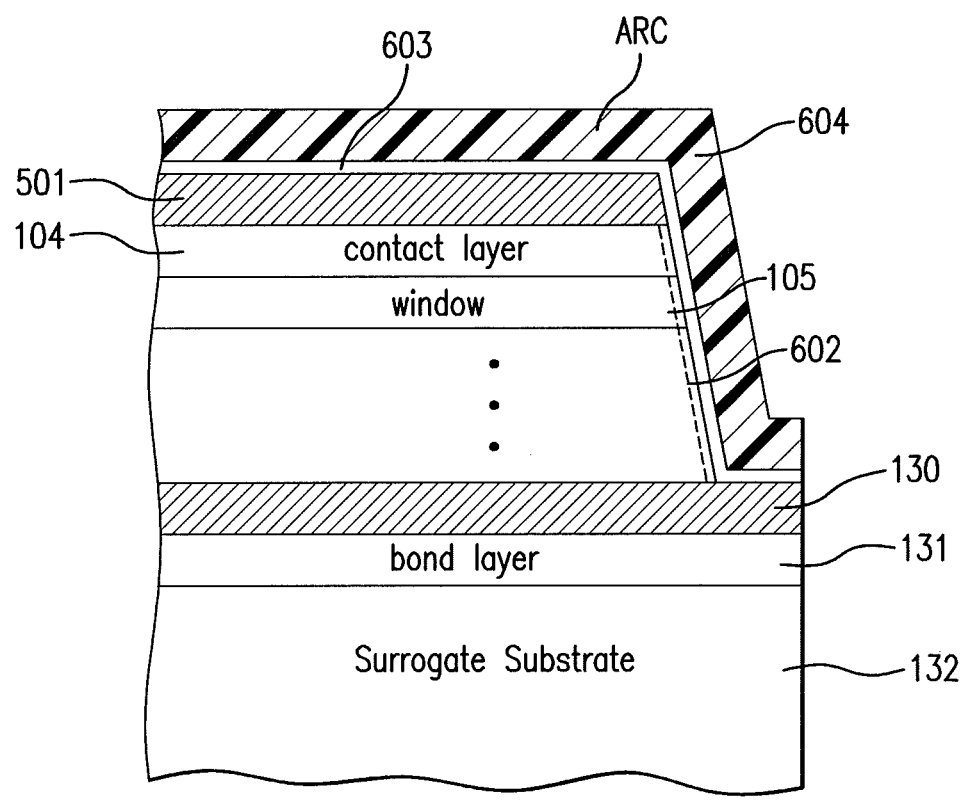
FIG. 12E is a cross-sectional view of the solar cell of FIG. 12D taken parallel to one of the grid lines 501.

FIG. 12E is a cross-sectional view of the solar cell of FIG. 12D taken parallel to one of the grid lines 501.

Figure 13A:
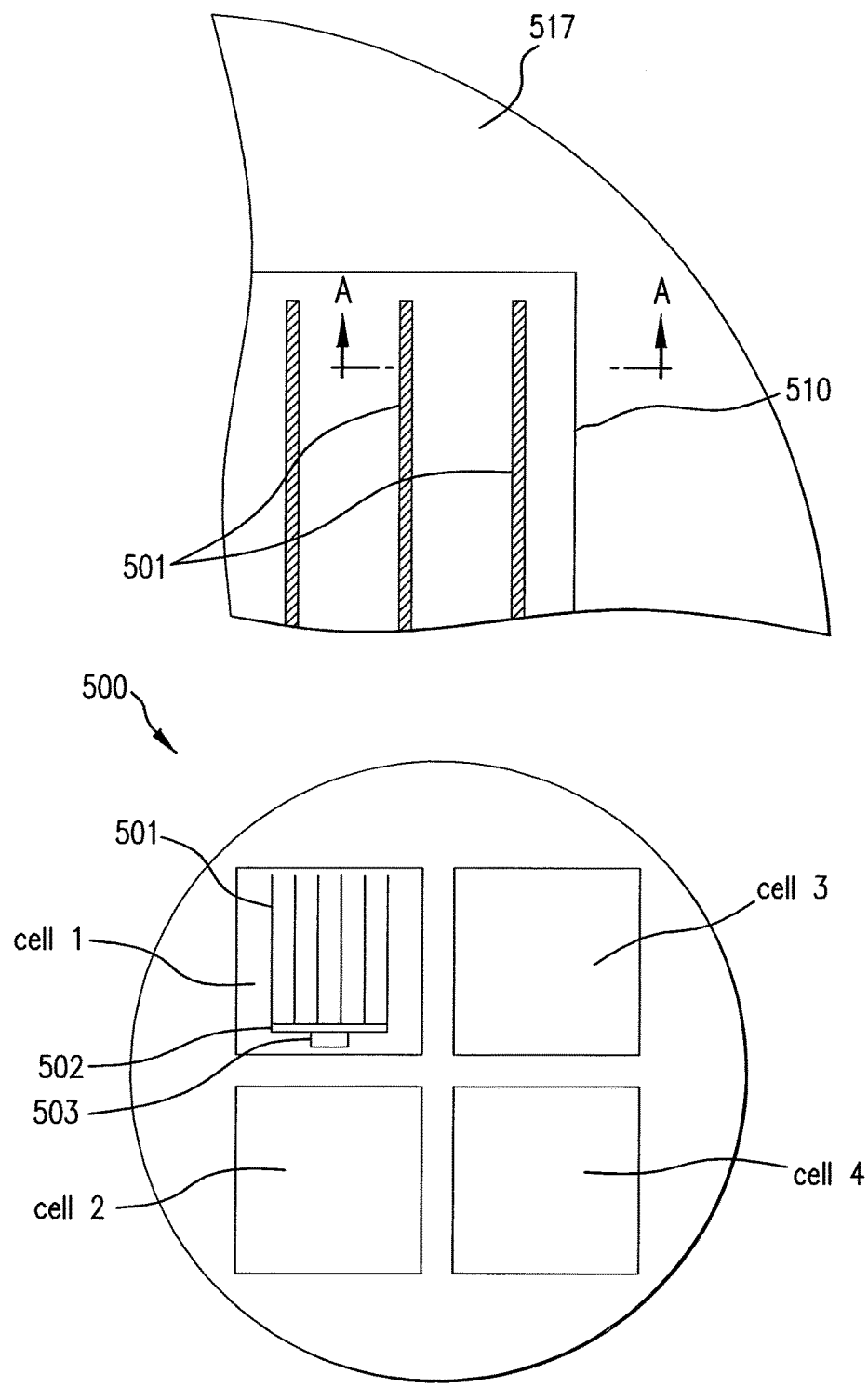
FIG. 13A is a top plan view of a wafer in which the solar cells are fabricated.

FIG. 13A is a top plan view of a wafer in which four solar cells are implemented. The depiction of four cells is for illustration for purposes only, and the present invention is not limited to any specific number of cells per wafer.

In each cell there are grid lines 501 (more particularly shown in cross-section in FIG. 9), an interconnecting bus line 502, and a contact pad 503. The geometry and number of grid and bus lines and the contact pad are illustrative and the present invention is not limited to the illustrated embodiment.

Figure 13B:
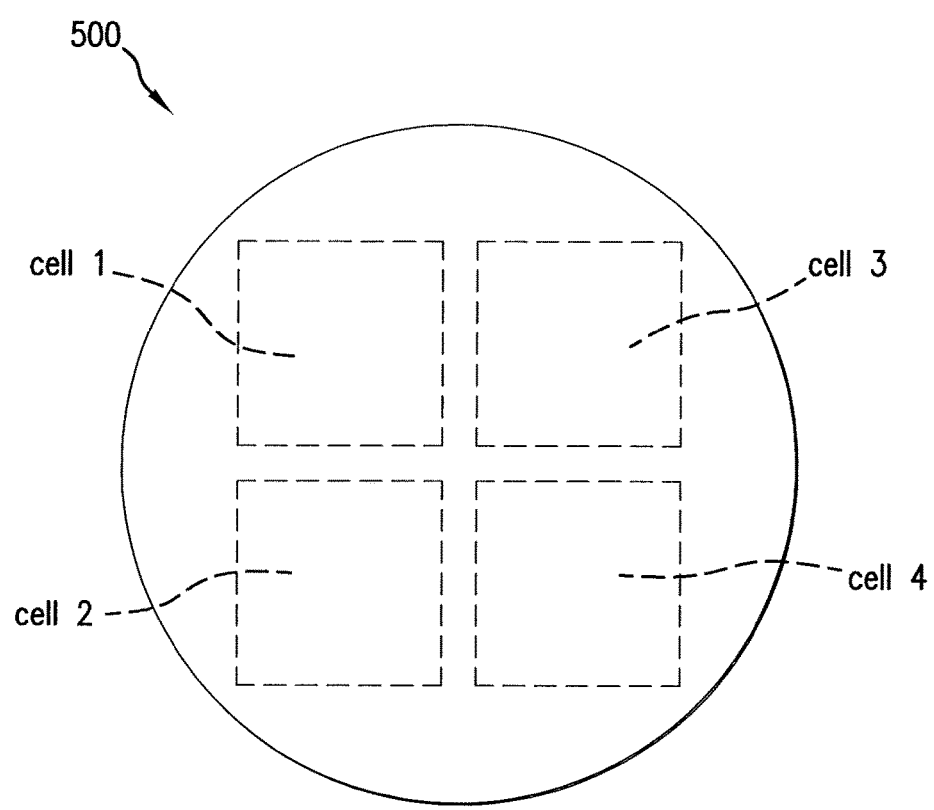
FIG. 13B is a bottom plan view of a wafer in which the solar cells are fabricated.

FIG. 13B is a bottom plan view of the wafer with four solar cells shown in FIG. 13A.

Figure 14:
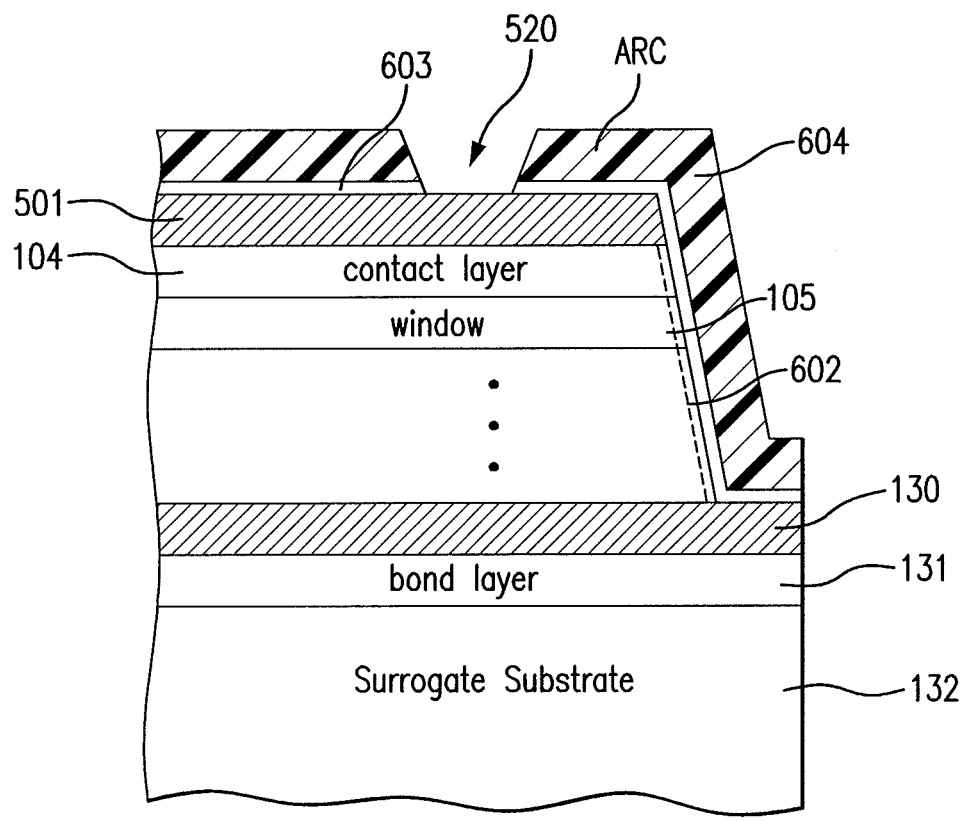
FIG. 14 is a cross-sectional view of the solar cell of FIG. 12D after the next process step.

FIG. 14 is a cross-sectional view of the solar cell of FIG. 12D after the next process step in which a contact opening is made through the ARC layer 604 and the layer 603 of silicon nitride or titanium dioxide to a contact pad 520 on the surface of metal layer or grid line 501. The opening is made by an etching process.

Figure 15:
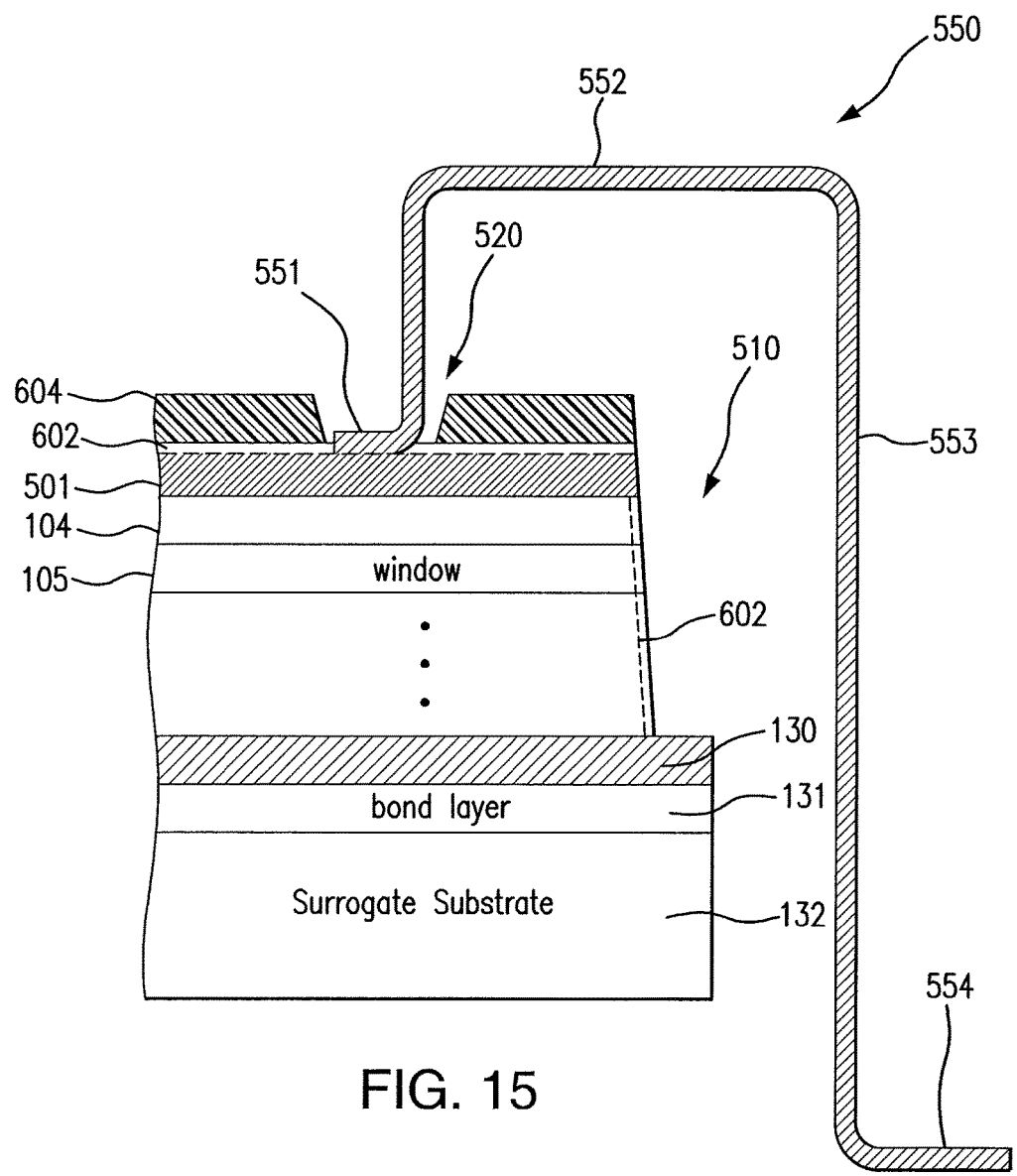
FIG. 15 is a cross-sectional view of the solar cell of FIG. 14 after the next process step.

FIG. 15 is a cross-sectional view of the solar cell of FIG. 14 after the next process step of the attachment of an interconnection member 550 to the metal contact pad 520. The interconnection member 550 is a planar rectangular clip having a first flat end-portion 551 welded to the metal contact layer 501 at the location of the contact pad 520, a second portion 552 connected to the first end-portion 551 and extending above the surface of the solar cell, and a third portion 553 connected to the second portion 552 and being serpentine in shape, and flat second end-portion 554 extending below the bottom of the solar cell so that it is designed and oriented to be welded to the bottom metal contact of an adjacent solar cell, thereby enabling the adjacent solar cells to be connected in electrical series.

Figure 16:
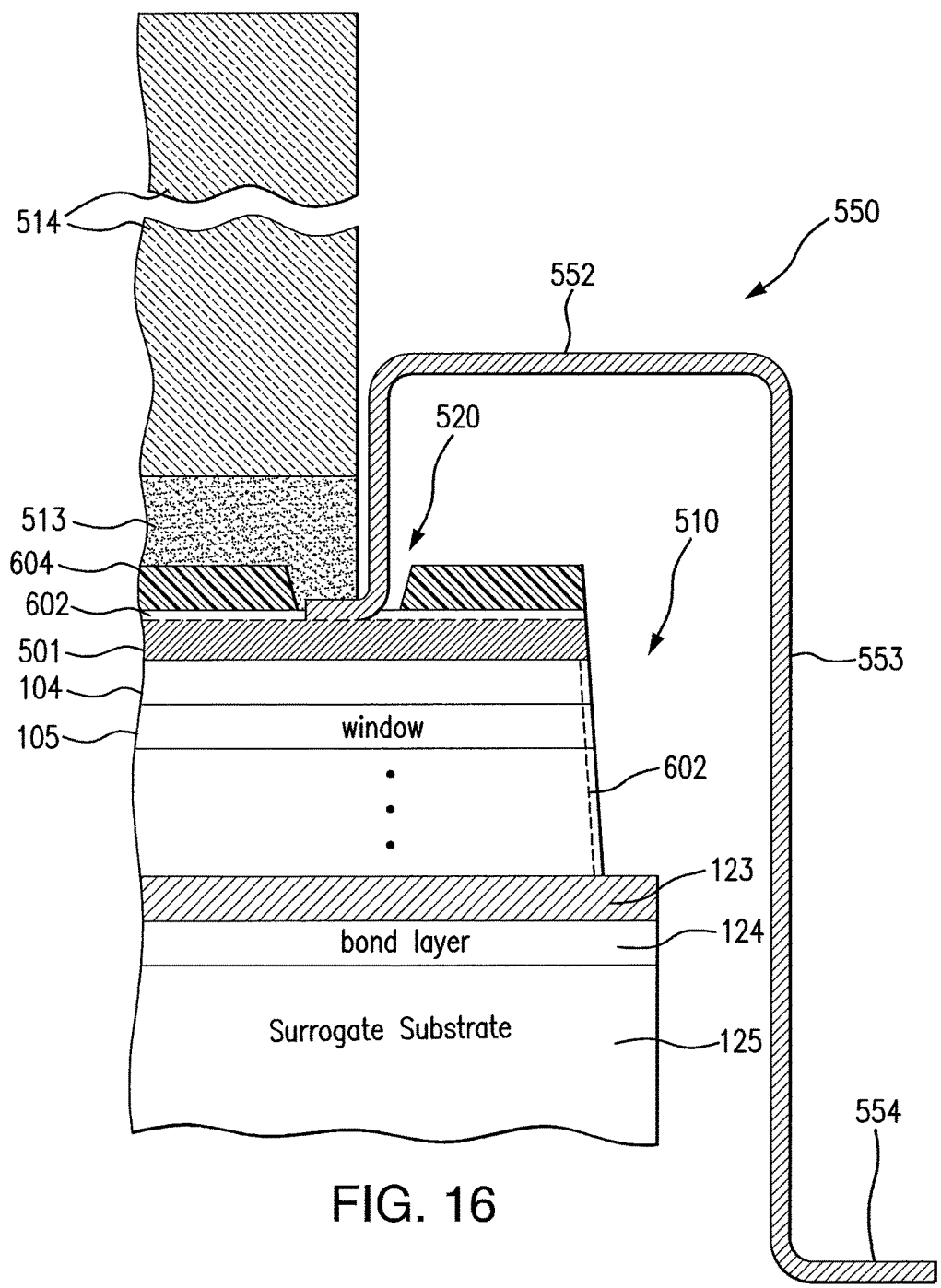
FIG. 16 is a cross-sectional view of the solar cell of FIG. 15 after the next process step.

FIG. 16 is a cross-sectional view of the solar cell of FIG. 15 after the next process step in an embodiment of the present invention in which a cover glass 514 is secured to the top of the cell by an adhesive 513. Although the use of a cover glass is the preferred in some applications, it is not necessary for all implementations, and additional layers or structures may also be utilized for providing additional support or environmental protection to the solar cell.

Figure 17:
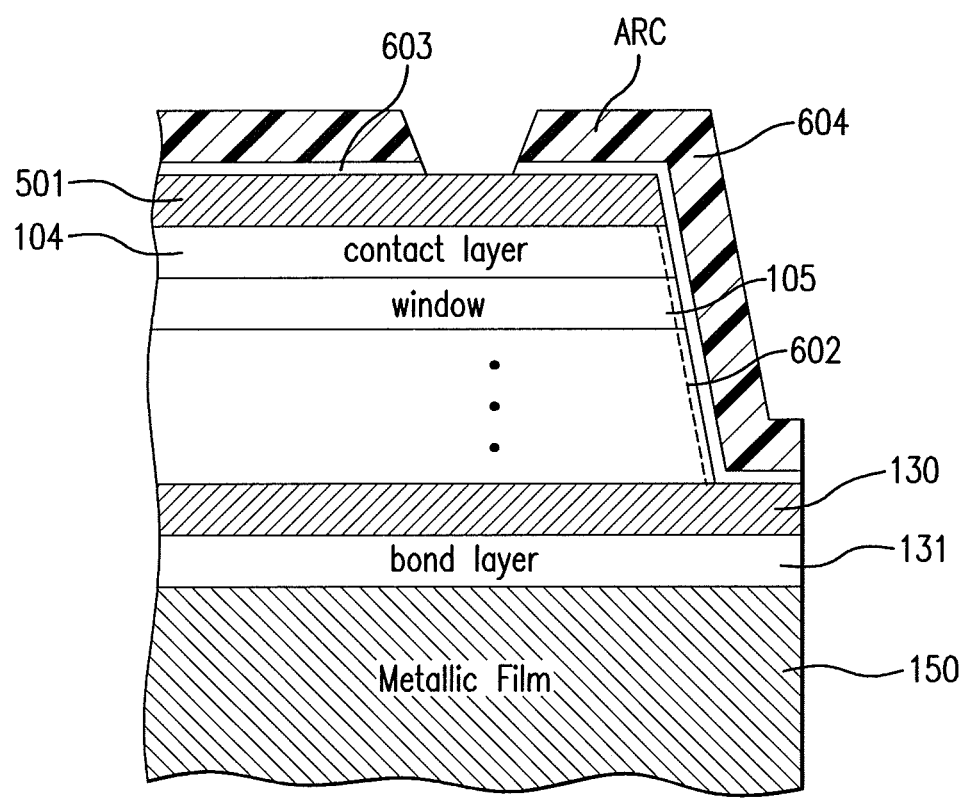
FIG. 17 is a cross-sectional view of another embodiment of the solar cell of FIG. 12D after the next process step.

FIG. 17 is a cross-sectional view of the solar cell in another embodiment of the present disclosure, similar to that of FIG. 14, except that in this embodiment, the surrogate substrate 132 depicted in FIG. 7 and subsequent figures to FIG. 12D, a metallic film 150 is utilized as the supporting structure. FIG. 17 illustrates the next process step in this embodiment in which a contact opening is made through the ARC layer 604 and the layer 603 of silicon nitride or titanium dioxide to a contact pad 520 on the surface of metal layer or grid line 501. The opening is made by an etching process.

Figure 18:
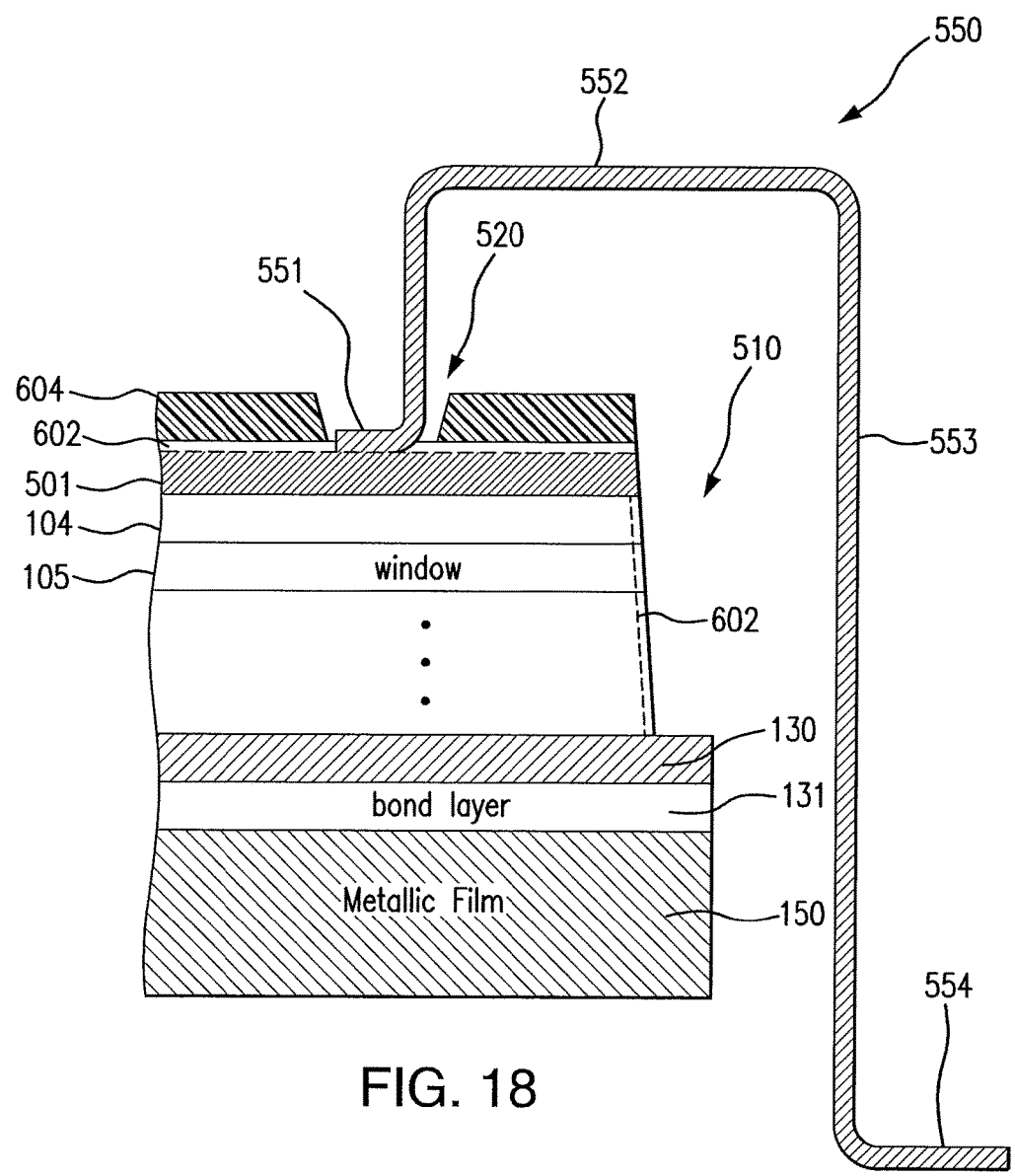
FIG. 18 is a cross-sectional view of the solar cell of FIG. 17 after the next process step.

FIG. 18 is a cross-sectional view of the solar cell of FIG. 17 after the next process step of the attachment of an interconnection member 550 to the metal contact pad 520. The interconnection member 550 is a planar rectangular clip having a first flat end-portion 551 welded to the metal contact layer 501 at the location of the contact pad 520, a second portion 552 connected to the first end-portion 551 and extending above the surface of the solar cell, and a third portion 553 connected to the second portion 552 and being serpentine in shape, and flat second end-portion 554 extending below the bottom of the solar cell so that it is designed and oriented to be welded to the bottom metal contact of an adjacent solar cell, thereby enabling the adjacent solar cells to be connected in electrical series.

Figure 19:
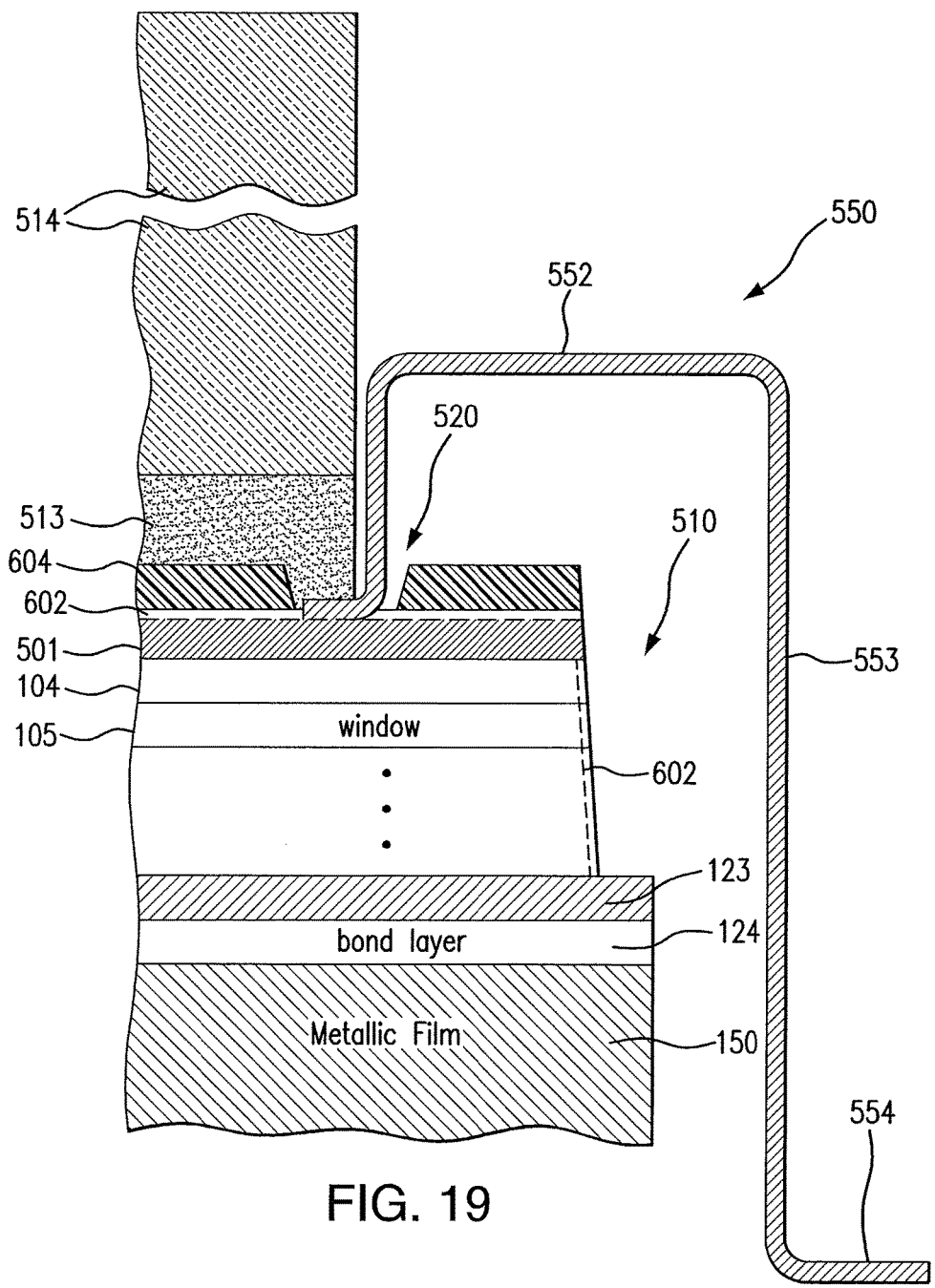
FIG. 19 is a cross-sectional view of the solar cell of FIG. 18 after the next process step.

FIG. 19 is a cross-sectional view of the solar cell of FIG. 18 after the next process step in an embodiment of the present invention in which a cover glass 514 is secured to the top of the cell by an adhesive 513. Although the use of a cover glass is the preferred in some applications, it is not necessary for all implementations, and additional layers or structures may also be utilized for providing additional support or environmental protection to the solar cell.

Figure 20:
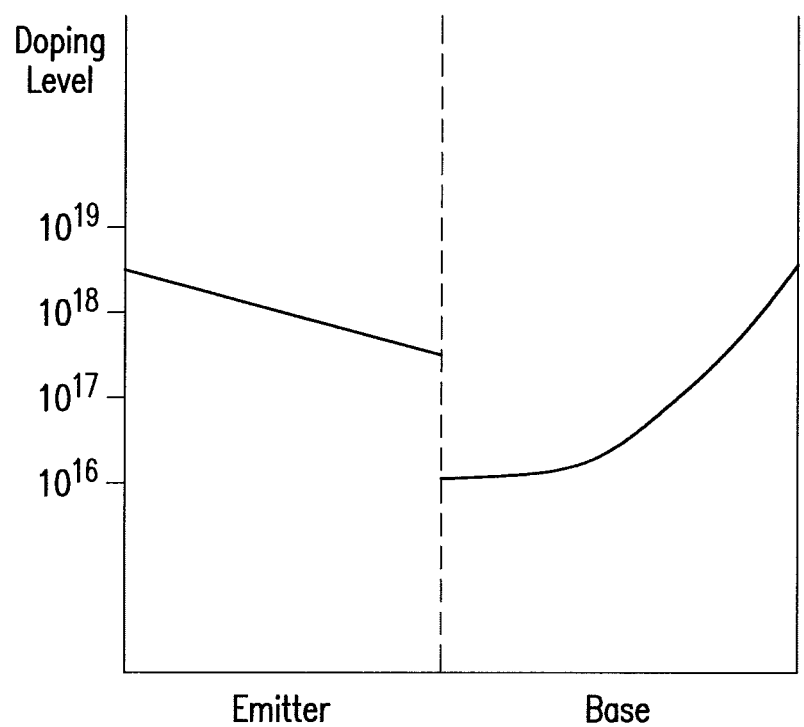
FIG. 20 is a graph of the doping profile in a base and emitter layers of a subcell in the metamorphic solar cell according to the present invention.

FIG. 20 is a graph of a doping profile in the emitter and base layers in one or more subcells of the inverted metamorphic multijunction solar cell of the present invention. The various doping profiles within the scope of the present invention and the advantages of such doping profiles are more particularly described in copending U.S. patent application Ser. No. 11/956,069 filed Dec. 13, 2007, herein incorporated by reference. The doping profiles depicted herein are merely illustrative, and other more complex profiles may be utilized as would be apparent to those skilled in the art without departing from the scope of the present invention.

Figure 21:
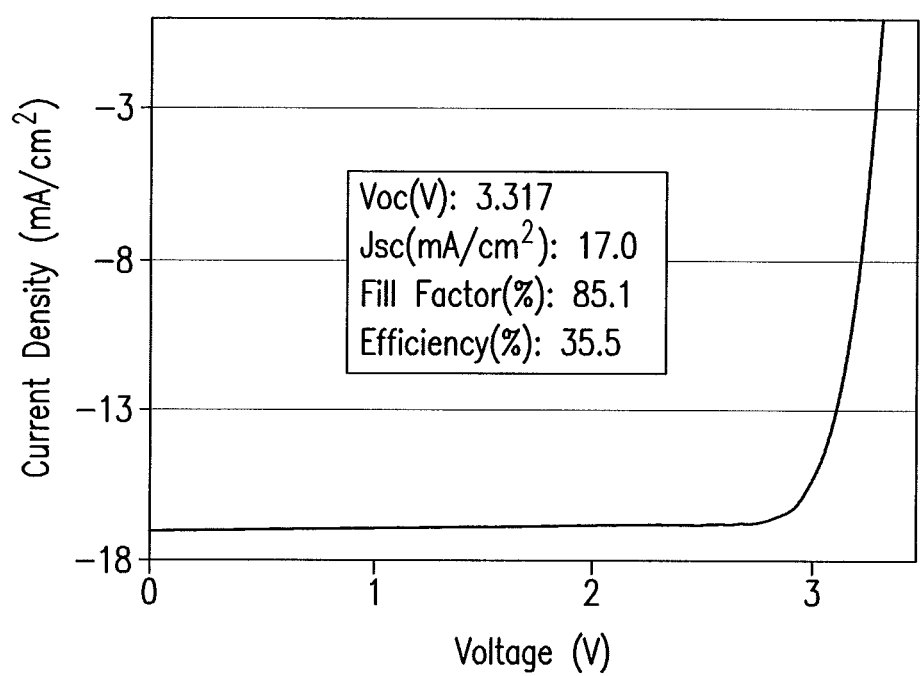
FIG. 21 is a graph that depicts the current and voltage characteristics of an inverted metamorphic multijunction solar cell according to the present invention.

FIG. 21 is a graph that depicts the current and voltage characteristics of one of the test solar cells fabricated according to the present invention. In this test cell, the lower fourth subcell had a band gap in the range of approximately 0.6 to 0.8 eV, the third subcell had a band gap in the range of approximately 0.9 to 1.1 eV, the second subcell had a band gap in the range of approximately 1.35 to 1.45 eV and the upper subcell had a band gap in the range of 1.8 to 2.1 eV. The solar cell was measured to have an open circuit voltage ($V_{oc}$) of approximately 3.317 volts, a short circuit current of approximately 17.0 mA/cm$^2$, a fill factor of approximately 85.1%, and an efficiency of 35.5%.

Figure 22:
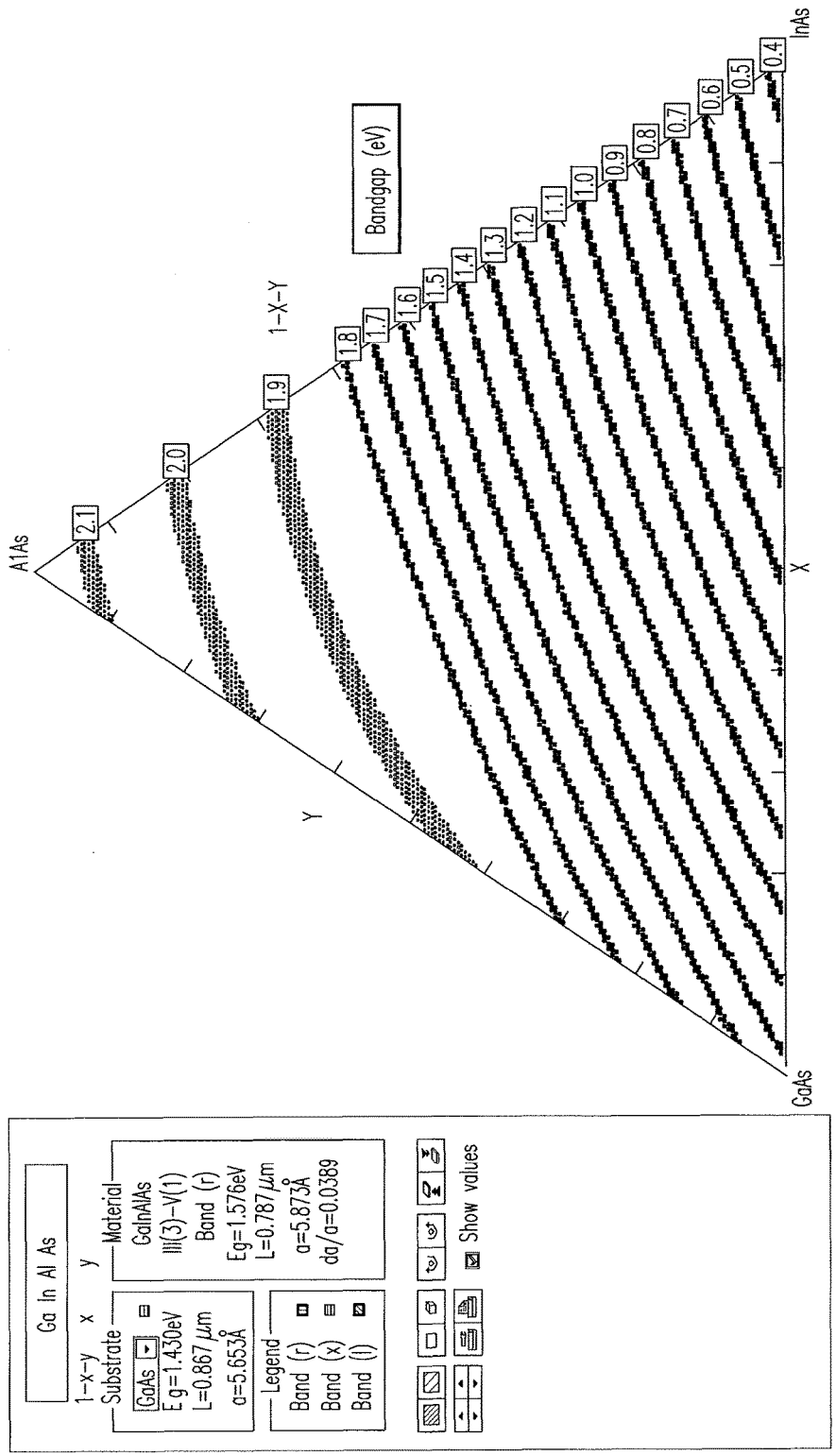
FIG. 22 is a diagram representing the range of band gaps of various GaInAlAs materials as a function of the relative concentration of Al, In, and Ga.

FIG. 22 is a diagram representing the range of band gaps of various GaInAlAs materials as a function of the relative concentration of Al, In, and Ga. This diagram illustrates how the selection of a constant band gap sequence of layers of GaInAlAs used in the metamorphic layer may be designed through the appropriate selection of the relative concentration of Al, In, and Ga to meet the different lattice constant requirements for each successive layer. Thus, whether 1.5 eV or 1.1 eV or other band gap value is the desired constant band gap, the diagram illustrates a continuous curve for each band gap, representing the incremental changes in constituent proportions as the lattice constant changes, in order for the layer to have the required band gap and lattice constant.

Figure 23:
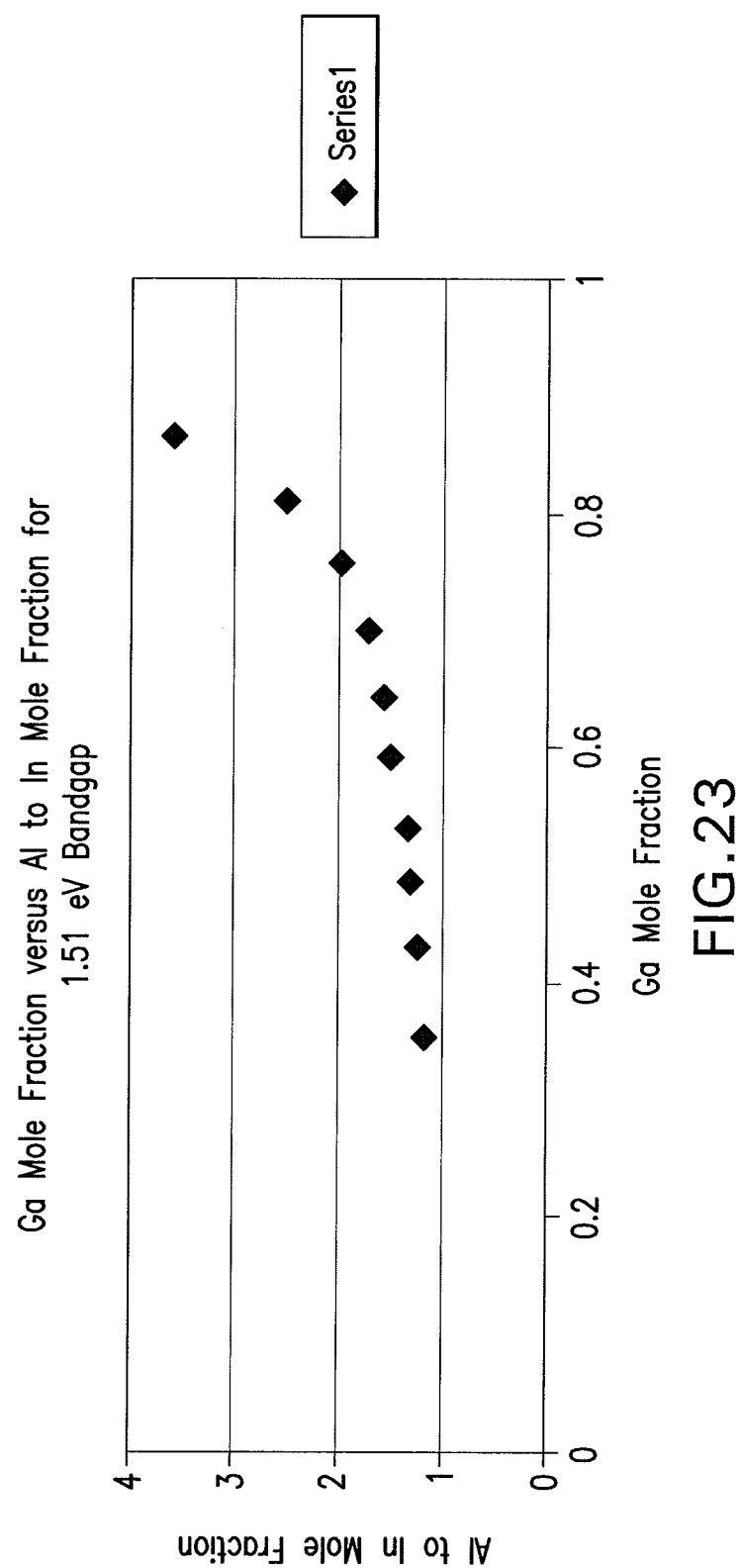
FIG. 23 is a graph representing the Ga mole fraction versus the Al to In mole fraction in GaInAlAs materials that is necessary to achieve a constant 1.5 eV band gap.

FIG. 23 is a graph that further illustrates the selection of a constant band gap sequence of layers of GaInAlAs used in the metamorphic layer by representing the Ga mole fraction versus the Al to In mole fraction in GaInAlAs materials that is necessary to achieve a constant 1.5 eV band gap.

Figure 24:
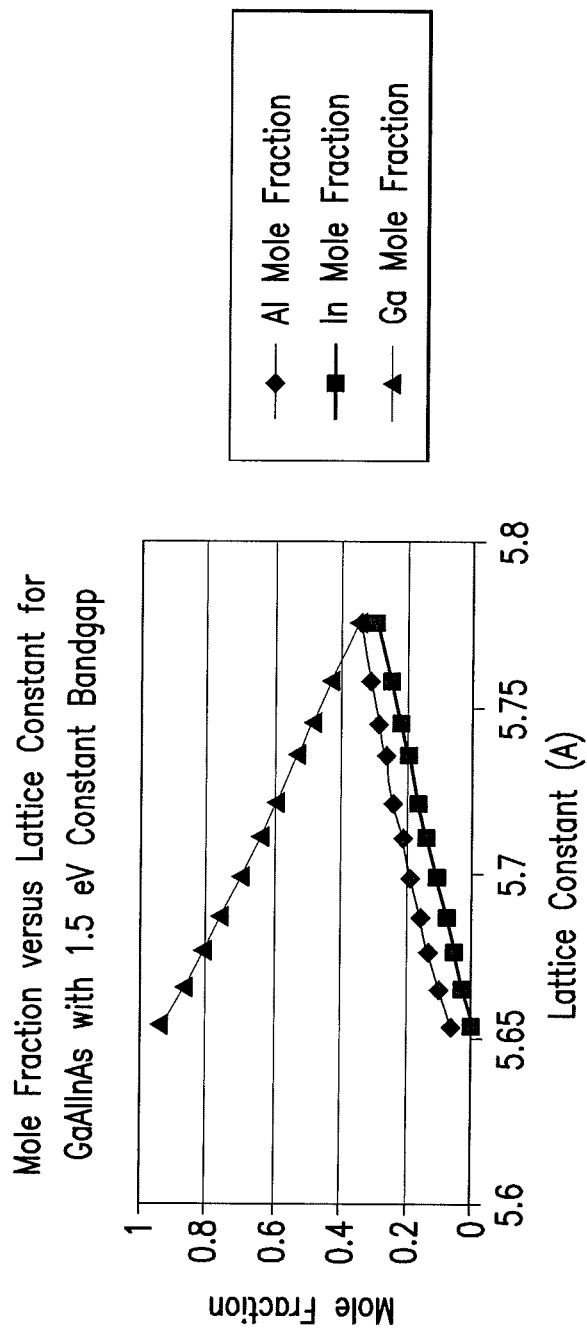
FIG. 24 is a graph representing the mole fraction versus lattice constant in GaInAlAs materials that is necessary to achieve a constant 1.5 eV band gap band gap.

FIG. 24 is a graph that further illustrates the selection of a constant band gap sequence of layers of GaInAlAs used in the metamorphic layer by representing the mole fraction versus lattice constant in GaInAlAs materials that is necessary to achieve a constant 1.5 eV band gap band gap.

It will be understood that each of the elements described above, or two or more together, also may find a useful application in other types of constructions differing from the types of constructions described above.

Although the preferred embodiment of the present invention utilizes a vertical stack of four subcells, the present invention can apply to stacks with fewer or greater number of subcells, i.e. two junction cells, three junction cells, five junction cells, etc. In the case of four or more junction cells, the use of more than one metamorphic grading interlayer may also be utilized.

In addition, although the present embodiment is configured with top and bottom electrical contacts, the subcells may alternatively be contacted by means of metal contacts to laterally conductive semiconductor layers between the subcells. Such arrangements may be used to form 3-terminal, 4-terminal, and in general, n-terminal devices. The subcells can be interconnected in circuits using these additional terminals such that most of the available photogenerated current density in each subcell can be used effectively, leading to high efficiency for the multijunction cell, notwithstanding that the photogenerated current densities are typically different in the various subcells.

As noted above, the present invention may utilize an arrangement of one or more, or all, homojunction cells or subcells, i.e., a cell or subcell in which the p-n junction is formed between a p-type semiconductor and an n-type semiconductor both of which have the same chemical composition and the same band gap, differing only in the dopant species and types, and one or more heterojunction cells or subcells. Subcell A, with p-type and n-type InGaP is one example of a homojunction subcell. Alternatively, as more particularly described in U.S. patent application Ser. No. 12/023,772 filed Jan. 31, 2008, the present invention may utilize one or more, or all, heterojunction cells or subcells, i.e., a cell or subcell in which the p-n junction is formed between a p-type semiconductor and an n-type semiconductor having different chemical compositions of the semiconductor material in the n-type regions, and/or different band gap energies in the p-type regions, in addition to utilizing different dopant species and type in the p-type and n-type regions that form the p-n junction.

In some cells, a thin so-called "intrinsic layer" may be placed between the emitter layer and base layer, with the same or different composition from either the emitter or the base layer. The intrinsic layer may function to suppress minority-carrier recombination in the space-charge region. Similarly, either the base layer or the emitter layer may also be intrinsic or not-intentionally-doped ("NID") over part or all of its thickness.

The composition of the window or BSF layers may utilize other semiconductor compounds, subject to lattice constant and band gap requirements, and may include AlInP, AlAs, AlP, AlGaInP, AlGaAsP, AlGaInAs, AlGaInPAs, GaInP, GaInAs, GaInPAs, AlGaAs, AlInAs, AlInPAs, GaAsSb, AlAsSb, GaAlAsSb, AlInSb, GaInSb, AlGaInSb, AlN, GaN, InN, GaInN, AlGaInN, GaInNAs, AlGaInNAs, ZnSSe, CdSSe, and similar materials, and still fall within the spirit of the present invention.

While the invention has been illustrated and described as embodied in a inverted metamorphic multijunction solar cell, it is not intended to be limited to the details shown, since various modifications and structural changes may be made without departing in any way from the spirit of the present invention.

Thus, while the description of this invention has focused primarily on solar cells or photovoltaic devices, persons skilled in the art know that other optoelectronic devices, such as, thermophotovoltaic (TPV) cells, photodetectors and light-emitting diodes (LEDS) are very similar in structure, physics, and materials to photovoltaic devices with some minor variations in doping and the minority carrier lifetime. For example, photodetectors can be the same materials and structures as the photovoltaic devices described above, but perhaps more lightly-doped for sensitivity rather than power production. On the other hand LEDs can also be made with similar structures and materials, but perhaps more heavily-doped to shorten recombination time, thus radiative lifetime to produce light instead of power. Therefore, this invention also applies to photodetectors and LEDs with structures, compositions of matter, articles of manufacture, and improvements as described above for photovoltaic cells.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention and, therefore, such adaptations should and are intended to be comprehended within the meaning and range of equivalence of the following claims.

The invention claimed is:
1. A method of manufacturing a solar cell comprising:
providing a first substrate;
forming an upper first solar subcell having a first band gap on said first substrate;
forming a second solar subcell adjacent to said first solar subcell and having a second band gap smaller than said first band gap;
forming a first graded interlayer adjacent to said second solar subcell, said first graded interlayer having a third band gap greater than said second band gap;
forming a third solar subcell adjacent to said first graded interlayer, said third subcell having a fourth band gap smaller than said second band gap such that said third subcell is lattice mismatched with respect to said second subcell;
forming a second graded interlayer adjacent to said third solar subcell, said second graded interlayer having a fifth band gap greater than said fourth band gap;
forming a lower fourth solar subcell adjacent to said second graded interlayer, said lower subcell having a sixth band gap smaller than said fourth band gap such that said fourth subcell is lattice mismatched with respect to said third subcell;
mounting a surrogate substrate on top of said fourth solar subcell;
removing the first substrate;
etching a first trough around the periphery of said solar cell to the surrogate substrate so as to form a mesa structure on said surrogate substrate;
passivating an exposed surface of the solar cell with a passivating solution;
depositing an encapsulating layer over the passivated surface by chemical vapor deposition immediately after the passivating step; and
depositing an anti-reflection coating layer over the encapsulating layer.

2. The method defined in claim 1, further comprising forming a backside contact layer on the lower fourth solar subcell.

3. The method as defined in claim 2, further comprising forming discrete, spaced-apart bonding pads over a surface of the backside contact layer.

4. The method as defined in claim 2, further comprising forming a contact metal layer over the backside contact layer.

5. The method as defined in claim 4, wherein the depth of the first trough extends down to said contact metal layer.

6. The method as defined in claim 1, wherein the passivating step is performed by application of ammonium sulphide.

7. The method as defined in claim 1, wherein the encapsulating layer is composed of silicon nitride or titanium oxide.

8. The method as defined in claim 1, wherein the passivating step is performed by dipping a wafer in a solution of ammonium sulphide.

9. A method as defined in claim 1, wherein the lower fourth subcell has a band gap in the range of 0.6 to 0.8 eV; the third subcell has a band gap in the range of 0.9 to 1.1 eV, the second subcell has a band gap in the range of 1.35 to 1.45 eV, and the first subcell has a band gap in the range of 1.8 to 2.1 eV.

10. A method as defined in claim 9, wherein the first substrate is composed of gallium arsenide or germanium, and the surrogate substrate is composed of sapphire, GaAs, Ge or Si.

11. A method as defined in claim 9, wherein the first graded interlayer is compositionally graded to lattice match the second subcell on one side and the third subcell on the other side, and the second graded interlayer is compositionally graded to lattice match the third subcell on one side and the bottom fourth subcell on the other side.

12. A method as defined in claim 9, wherein said first graded interlayer is composed of any of the As, N, Sb based III-V compound semiconductors subject to the constraints of having the in-plane lattice parameter greater or equal to that of the second subcell and less than or equal to that of the third subcell, and having a band gap energy greater than that of the second subcell and of the third subcell.

13. A method as defined in claim 9, wherein said second graded interlayer is composed of any of the As, N, Sb based III-V compound semiconductors subject to the constraints of having the in-plane lattice parameter greater or equal to that of the third subcell and less than or equal to that of the bottom fourth subcell, and having a band gap energy greater than that of the third subcell and of the fourth subcell.

14. A method as defined in claim 9, wherein the first and second graded interlayers are composed of $(In_xGa_{1-x})_yAl_{1-y}As$ with x and y selected such that the band gap of each interlayer remains constant throughout its thickness.

15. A method as defined in claim 9, wherein the band gap of the first graded interlayer remains constant at 1.5 eV, and the band gap of the second graded interlayer remains constant at 1.1 eV.

16. A method as defined in claim 9, wherein the first subcell is composed of an InGaP emitter layer and an InGaP base layer, the second subcell is composed of an InGaP emitter layer and a GaAs base layer, the third subcell is composed of an InGaP emitter layer and an InGaAs base layer, and the bottom fourth subcell is composed of an InGaAs base layer and an InGaAs emitter layer lattice matched to the base layer.

* * * * *